(12) United States Patent
Jiang et al.

(10) Patent No.: US 9,207,302 B2
(45) Date of Patent: Dec. 8, 2015

(54) FULLY-AUTOMATIC VERIFICATION SYSTEM FOR INTELLIGENT ELECTRIC ENERGY METERS

(76) Inventors: Xueming Jiang, Hangzhou (CN); Jiong Zhu, Hangzhou (CN); Yan Zhang, Hangzhou (CN); Jinjuan Huang, Hangzhou (CN); Li Yao, Hangzhou (CN); Tao Xiao, Hangzhou (CN); Yongjin Xu, Hangzhou (CN); Feng Xie, Shaoxing (CN)

( * ) Notice: Subject to any disclaimer, the term of this patent is extended or adjusted under 35 U.S.C. 154(b) by 189 days.

(21) Appl. No.: 13/980,538

(22) PCT Filed: Nov. 28, 2011

(86) PCT No.: PCT/CN2011/083028
§ 371 (c)(1),
(2), (4) Date: Jul. 18, 2013

(87) PCT Pub. No.: WO2012/100593
PCT Pub. Date: Aug. 2, 2012

(65) Prior Publication Data
US 2013/0299306 A1     Nov. 14, 2013

(30) Foreign Application Priority Data

| | | |
|---|---|---|
| Jan. 30, 2011 | (CN) | 2011 1 0033380 |
| Jan. 30, 2011 | (CN) | 2011 1 0033398 |
| Mar. 30, 2011 | (CN) | 2011 1 0077573 |
| Apr. 19, 2011 | (CN) | 2011 1 0098177 |
| Jul. 22, 2011 | (CN) | 2011 1 0207318 |
| Jul. 22, 2011 | (CN) | 2011 1 0208082 |
| Jul. 22, 2011 | (CN) | 2011 2 0260888 U |

(51) Int. Cl.
*B21B 39/00* (2006.01)
*G01R 35/04* (2006.01)
*B65G 49/00* (2006.01)

(52) U.S. Cl.
CPC ............ *G01R 35/04* (2013.01); *B65G 49/00* (2013.01)

(58) Field of Classification Search
CPC ........................................ B65G 37/025
USPC ....................................... 198/339.1
See application file for complete search history.

(56) References Cited

U.S. PATENT DOCUMENTS

| | | | |
|---|---|---|---|
| 4,845,843 A | | 7/1989 | Babcock |
| 6,563,301 B2 * | | 5/2003 | Gventer ............... 324/750.27 |
| 2009/0179072 A1 * | | 7/2009 | Szesko et al. ............ 235/375 |

FOREIGN PATENT DOCUMENTS

| | | |
|---|---|---|
| CN | 1544893 Y | 11/2004 |
| CN | 2702321 Y | 5/2005 |

(Continued)

OTHER PUBLICATIONS

Han, Y.H., *A Design of Multi-set Automatic Withstanding Voltage Testing Equipment for Electric EnergyMeter*, Mar. 2006, pp.42-44.

(Continued)

*Primary Examiner* — Gene Crawford
*Assistant Examiner* — Lester Rushin
(74) *Attorney, Agent, or Firm* — Wolf, Greenfield & Sacks, P.C.

(57) ABSTRACT

A fully-automatic verification system for intelligent electric energy meters comprises a plurality of verification units for automatic verification of the electric energy meters, main transport lines for connecting the verification units, and a verification management system for coordinating the work of the verification units. The main transport lines comprise upper transport lines for transporting boxes carrying electric energy meters to be verified to the verification units and lower transport lines for transporting the boxes carrying the electric energy meters back to the warehouse. The verification system for electric energy meters can implement fully-automatic verification, thus enhancing the efficiency and the verification accuracy.

18 Claims, 16 Drawing Sheets

(56) References Cited

FOREIGN PATENT DOCUMENTS

| | | |
|---|---|---|
| CN | 201285442 Y | 8/2005 |
| CN | 101104208 A | 1/2008 |
| CN | 201021936 Y | 2/2008 |
| CN | 101464504 A | 6/2009 |
| CN | 201293199 Y | 8/2009 |
| CN | 101539617 A | 9/2009 |
| CN | 101556324 A | 10/2009 |
| CN | 201532458 U | 7/2010 |
| CN | 101893696 A | 11/2010 |
| CN | 101923151 A | 12/2010 |
| CN | 101923154 A | 12/2010 |
| CN | 102121980 A | 7/2011 |
| CN | 201993460 U | 9/2011 |
| CN | 201993461 U | 9/2011 |
| CN | 202057783 U | 11/2011 |
| CN | 202075404 U | 12/2011 |
| CN | 202177694 U | 3/2012 |
| CN | 202177942 U | 3/2012 |
| DE | 3216549 A1 | 11/1983 |
| JP | 1038989 A | 2/1998 |
| JP | 2008247601 A | 10/2008 |

OTHER PUBLICATIONS

Huang, L, et al., *Research of a watt-hour meter test device for automatic pulse counting and voltage withstand testing*, Collage of Computer and Control Engineering, Harbin University of Science and Technology, Harbin, 150080, 2002, No. 11, pp. 34-37.

Meng, Lei et al., *Design and application of integrated system of intelligent storage and verification for smart meter*, Zhejiang Electric Power, dated Jul. 12, 2010, pp. 18-21.

International Search Report from corresponding International Application No. PCT/CN2011/083028 dated Mar. 8, 2012.

* cited by examiner

FULLY-AUTOMATIC VERIFICATION SYSTEM FOR INTELLIGENT ELECTRIC ENERGY METERS

This application is a national phase of International Application No. PCT/CN2011/083028, entitled "FULLY-AUTOMATIC VERIFICATION SYSTEM FOR INTELLIGENT ELECTRIC ENERGY METERS", filed Nov. 28, 2011, which claims the benefit of priority to the following Chinese patent applications:

Application No. 201110208082.5 entitled "VERIFICATION SYSTEM FOR ELECTRICITY METER", filed Jul. 22, 2011;

Application No. 201110077573.0 entitled "VOLTAGE-WITHSTAND TESTING DEVICE FOR ELECTRICITY METER", filed Mar. 30, 2011; Application No. 201110098177.6 entitled "AUTOMATIC TRIGGER DEVICE AND METHOD FOR ELECTRICITY METER PROGRAMMABLE SWITCH", filed Apr. 19, 2011;

Application 201110207318.3 entitled "VERIFICATION UNIT FOR ELECTRICITY METER AND OPERATION METHOD OF THE SAME", filed Jul. 22, 2011;

Application No. 201120260888.4 entitled "ROBOT LOADING-UNLOADING DEVICE FOR ELECTRICITY METER", filed Jul. 22, 2011;

Application No. 201110033380.5 entitled "MULTI-POSITION PALLET FOR ONLINE DETECTION OF ELECTRICITY METER", Jan. 30, 2011;

Application 201110033398.5 entitled "SINGLE-POSITION PALLET FOR ONLINE DETECTION OF ELECTRICITY METER", filed Jan. 30, 2011; and all of which applications are hereby incorporated herein by reference to the maximum extent allowable by law.

FIELD OF THE INVENTION

The present application relates to the field of the electricity meter, and particularly to a fully-automatic verification system for a smart electricity meter.

BACKGROUND OF THE INVENTION

At present, the verification of the electricity meter mainly employs multiple groups of manual verification platforms and the verification is performed manually. The conventional manual verification manner has some drawbacks, for example, a great amount of repetitive and mechanical operations such as loading, meter-suspending, wire-crimping, wire-removing, unloading and boxing are performed manually, and it has a high labor intensity, a low verification efficiency, and is error-prone in operation.

Therefore, there is an urgent demand for the person skilled in the art to provide a fully-automatic verification system for the smart electricity meter to overcome the drawbacks in the prior art.

SUMMARY OF THE INVENTION

The technical problem to be solved by the present application is to improve the existing technical solution, and to provide a fully-automatic verification system for a smart electricity meter, to achieve the fully-automatic verification, improve the verification efficiency, and insure the accuracy of the verification result.

In view of this, it is provided according to the present application the following technical solutions.

A fully-automatic verification system for a smart electricity meter in eluding a plurality of verification units for the automatic verification of the electricity meter, a main conveying line for connecting the verification units, and a verification management system for coordinating operations of the verification units.

The main conveying line includes an upper conveying line and a lower conveying line.

The fully-automatic verification system for the smart electricity meter according to embodiments of the present application includes a verification management system which is configured to perform the downloading, executing and scheduling of the electricity meter verification task, the balancing of the jobs, the requesting and conveying of the electricity meter box, the reading and determining of the barcode, shunting of the meter box, the feedback of the executing of the task, and the information collecting of the main conveying line and the verification unit (including abnormal information of the system), thereby the main conveying line, the automatic stereoscopic warehouse and the verification unit are integrated efficiently, achieving the fully-automatic unmanned operation, and thus improving the time-consuming, mechanical and repetitive operation, increasing the verification/detection efficiency, and reducing the labor intensity.

Since the apparatus of the single/three-phase verification system is large in scale, the fully-automatic verification system for the smart electricity meter according to embodiments of the present application can solve the problems that there are a large number of complicated data and too many operation control points in many systems by centralized control, thereby achieving more with less, and it has such advantages as high operation efficiency, low production cost, low labor intensity, high safety and high quality.

The present application further includes the following additional technical features as further improvements and supplements to the above technical solution.

Preferably, an entrance of the main conveying line is provided with a supplying meter box temporary storage area for temporarily storing the meter box and a meter box barcode reading apparatus. The meter box barcode reading apparatus is located in front of the meter box temporary storage area.

Preferably, an entrance of the verification unit is provided with: a shunting apparatus connected to the upper conveying line of the main conveying line, for shunting the meter box located on the upper conveying line and having an electricity meter to be verified to corresponding verification unit; and a supplying meter box temporary storage area for temporarily storing the meter box.

An exit of the verification unit is provided with a merging apparatus connected to the lower conveying line of the main conveying line, for merging the meter box, the electricity meter in which have been verified, into the lower conveying line.

The shunting apparatus is provided with a shunting barcode reading apparatus for reading barcodes of smart electricity meters to determine types of the smart electricity meters, to adjust operating modes of the verification units.

Preferably, the verification management system includes a supplying-discharging control module for controlling the coordinated conveying between the warehouse and the main conveying line, a distributing module for controlling the shunting and the merging of a single verification unit, and a master control module for job scheduling and information monitoring.

Preferably, the verification unit for the electricity meter includes a logistics conveying line connected to the main conveying line for conveying a turnover box; a loading device located beside a loading station of the logistics conveying line for moving an electricity meter located on the loading station of the logistics conveying line to a verification conveying line; the verification conveying line for moving the electricity meter to stations corresponded to various devices; a voltage-withstand testing device for a high-voltage detection of the electricity meter; a programmable switch trigger device for turning a cover of the electricity meter and pressing a programmable switch; a verification device for verifying items of the electricity meter to be verified one by one; a lead sealing and laser marking device for the lead sealing and identification information recording of a qualified electricity meter; an unloading device located beside an unloading station of the logistics conveying line, for transferring the electricity meter having been verified from the verification conveying line to the logistics conveying line; and a verification unit-management module for coordinating operations among various devices, the logistics conveying line and the verification conveying line, and an accurate sorting of the electricity meter based on information from the voltage-withstand testing device and the verification device.

The loading device, the voltage-withstand testing device, the programmable switch trigger device, the verification device, the lead sealing and laser marking device, and the unloading device are arranged sequentially along the advancing convey direction of the verification conveying line.

The logistics conveying line, the verification conveying line and various devices are coordinated with one another, such that the verification is completed directly on the verification conveying line, thereby achieving the fully-automatic verification of the electricity meter, which has a high efficiency, can avoid errors caused by manual detection, and increases the accuracy of the sorting. The laser marking is employed to substitute the traditional certification stuck on the electricity meter, which facilitates the management and use of the electricity meter.

Preferably, the verification unit for the electricity meter further includes: an appearance and energization inspecting device; an appearance and energization inspecting device for taking pictures of an appearance and a display screen of the electricity meter and performing corresponding processes; an unloading temporary storage area located between the unloading device and the verification device for temporarily storing an electricity meter having been detected, so as to achieve an ordered control of the streamline; a loading temporary storage area located between the voltage-withstand testing device and the verification device for temporarily storing an electricity meter to be detected; and a turnover box temporary storage area located between the loading device and the unloading device for conveying an empty turnover box at the loading station to the unloading station and temporarily storing the same. The turnover box temporary storage area is provided with a turnover box conveying line and a turnover box protecting mechanism. The charge controlling and parameter setting device includes a main control module for automatically changing a card; an analog card which can be inserted into a card slot of an electricity meter being detected; an analog card drive mechanism connected with the analog card for driving the analog card to move up and down, so as to achieve the insertion and removal of the analog card; a card reading module for reading information of the electricity meter being detected; an analog card contact determining module for determining contact information of the analog card based on the information read from the card; and an automatic card changing control module for controlling an SCM to change the card.

The programmable switch trigger unit includes a power supply for supplying power to the electricity meter, a cover-opening mechanism for opening the cover of the electricity meter and a programmable switch-pressing mechanism for pressing the programmable switch.

The turnover box temporary storage area is provided with a turnover box conveying line and a turnover box protecting mechanism.

The appearance and energization inspecting device is provided on a station at which the voltage-withstand testing device or the verification device is located.

The charge controlling and parameter setting device can rapidly inspect whether the analog card is well contacted with the electricity meter and automatically change the card, thus insuring the reliability of the insertion of the card in the electricity meter. The electricity meter can be calibrated normally by the fully-automatic card insertion, thereby improving the operation efficiency and reducing errors in operation.

The verification conveying line includes a frame, a driving motor provided on the frame for driving a belt to move forward, a belt conveyor connected with a rotary shaft of the driving motor, a stopping mechanism provided on the frame for accurately stopping a pallet on the belt conveyor, a counter provided on the frame for counting the electricity meter, a barcode scanner provided on the frame for recording information of the electricity meter, and a sorting mechanism for sorting the electricity meter.

Each electricity meter verification unit is provided with a plurality of verification branches arranged in parallel, and a plurality of verification devices are provided on the verification branches. The beginning and the end of the verification conveying line are connected with each other, and the verification conveying line is provided with a pallet which is cooperated with the verification conveying line and configured for carrying the electricity meter, such that the electricity meter is sequentially conveyed to stations at which the voltage-withstand testing device, the verification device, and the lead sealing and laser marking device are located. A pallet temporary storage area is provided on the verification conveying line between the unloading device and the loading device for temporarily storing the pallet, and the pallet temporary storage area responds to the loading requirement of the loading device.

The loading device includes a loading robot for accurately placing an electricity meter, which is to be verified and located on the logistics conveying line, onto a pallet on the verification conveying line and grabbing a turnover material box onto the unloading conveying line such that it is conveyed to the unloading station.

The loading robot includes a loading robot arm, a controller for controlling the robot arm to act, and a loading clamp connectable to a lower end of the robot arm.

The unloading device includes an unloading robot configured for placing an electricity meter having been detected and located on the pallet on the verification conveying line into a turnover material box and grabbing the turnover material box onto the logistics conveying line.

The unloading robot includes an unloading robot arm, a controller for controlling the robot arm to act, and an unloading clamp connectable to a lower end of the unloading robot arm.

The loading robot is provided with a locating platform for accurately locating the electricity meter. The loading robot arm grabs the electricity meter on the logistics conveying line and places the same on the locating platform such that it is located, and then grabs the electricity meter again and places the same on the pallet located on the verification conveying line.

Each of the voltage-withstand device and the verification device includes a frame, a longitudinal crimp drive mechanism provided on the frame, a connecting terminal connected to the longitudinal crimp drive mechanism and is movable longitudinally, a drive control module connected to the longitudinal crimp drive mechanism for controlling an action of the longitudinal crimp drive mechanism, and a test module connected to the connecting terminal. The connecting terminal includes a terminal block connected to the longitudinal crimp drive mechanism and a plurality of probes passed through the terminal block.

The probe includes strong and weak electricity pins for connecting the electricity meter. The voltage-withstand device is provided with a high voltage program-controlled power source connected with strong and weak electric connecting terminals of the electricity meter for providing a high voltage output, and a voltage-withstand platform fixed to the frame. The longitudinal crimp drive mechanism of the voltage-withstand device is provided on the voltage-withstand platform.

Advantageous technical effects: the verification management system of the fully-automatic verification system for the smart electricity meter according to embodiments of the present application achieves functions of the downloading, executing and scheduling of the electricity meter verification task, the balancing of the jobs, the requesting and conveying of the electricity meter box, the reading and determining of the barcode, the shunting of the meter box, the feedback of the executing of the task, and the information collecting of the main conveying line and the verification unit (including abnormal information of the system), thereby the main conveying line, the automatic stereoscopic warehouse and the verification unit are integrated efficiently, achieving the fully-automatic unmanned operation, and thus improving the time-consuming, mechanical and repetitive operation, increasing the verification/detection efficiency, and reducing the labor intensity. Because the apparatus of the single/three-phase verification system is large in scale, the problem that there are a large number of complicated data and too many operation control points in many systems can be solved by the whole system control, thereby achieving more with less with the centralized control, and it has such advantages as high operation efficiency, low production cost, low labor intensity, high safety and high quality.

Reference Signs In The Figures

1—logistics conveying line; 2—loading device; 3—voltage-withstand testing device; 4—programmable switch trigger device; 5—verification conveying line; 6—loading temporary storage area; 7—verification device; 8—unloading temporary storage area; 9—lead sealing and laser marking device; 10—charge controlling and parameter setting device; 11—unloading device; 12—main conveying line; 13—supplying meter box temporary storage area; 14—verification unit.

DETAILED DESCRIPTION

Technical solutions of the present application will be described in detail in conjunction with the accompanying drawings hereinafter.

Figure 1:
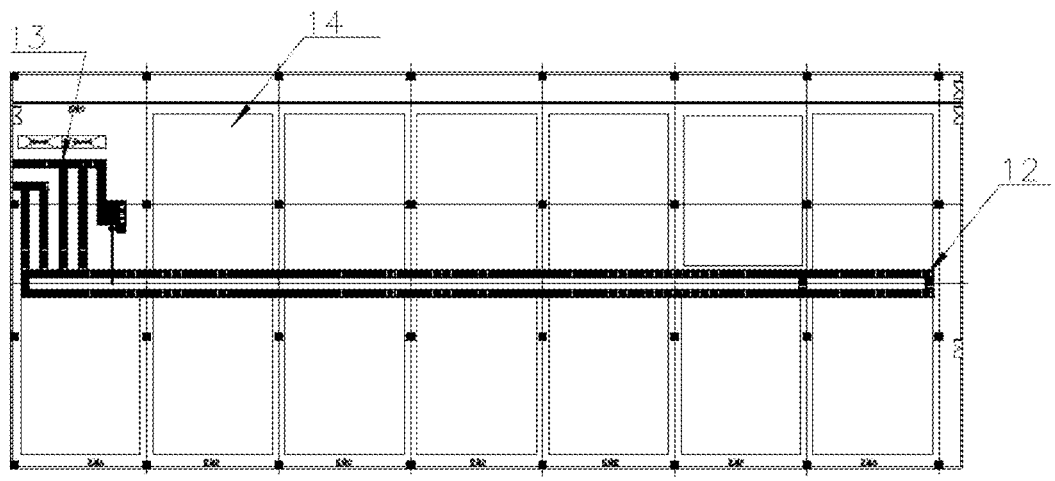
FIG. 1 is a structural schematic view of a fully-automatic verification system for a single-phase smart electricity meter.
Figure 2:
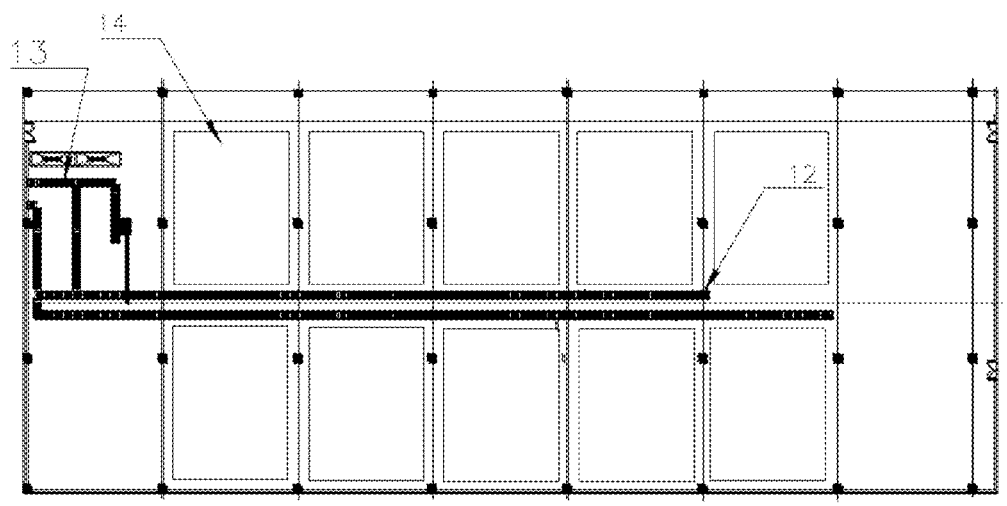
FIG. 2 is a structural schematic view of a fully-automatic verification system for a three-phase smart electricity meter.

Reference may be made to FIGS. 1 and 2, FIG. 1 is a structural schematic view of a fully-automatic verification system for a single-phase smart electricity meter; and FIG. 2 is a structural schematic view of a fully-automatic verification system for a three-phase smart electricity meter.

The fully-automatic verification system for the smart electricity meter according to embodiments of the present application includes a plurality of verification units 14 for the automatic verification of the electricity meter, a main conveying line 12 for connecting the verification units 14, and a verification management system for coordinating operations of the verification units 14.

The main conveying line 12 includes an upper conveying line for conveying the meter box having electricity meters to be verified to the verification unit 14 and a lower conveying line for conveying the meter box having verified electricity meters back to a warehouse.

An entrance of the main conveying line 12 is provided with: a supplying meter box temporary storage area 13 for temporarily storing the meter box; and a meter box barcode reading apparatus for reading the barcode of the meter box so as to determine the readability of the barcode and determine whether the meter box being conveyed belong to current verification task. The meter box barcode reading apparatus is located in front of the supplying meter box temporary storage area, such that the meter box which meets the requirement is conveyed to the supplying meter box temporary storage area 13.

An entrance of the verification unit is provided with: a shunting apparatus connected to the upper conveying line of the main conveying line, for shunting the meter box which is located on the upper conveying line and has electricity meters to be verified to corresponding verification unit 14; and a supplying meter box temporary storage area for temporarily storing the meter box. An exit of the verification unit 14 is provided with a merging apparatus connected to the lower conveying line of the main conveying line 12, for merging meter boxes, electricity meters in which have been verified, to the lower conveying line.

The shunting apparatus is provided with a shunting barcode reading apparatus for reading barcodes to determine types of meters, so as to adjust operating modes of the verification units 14.

The verification management system includes a supplying-discharging control module for controlling the coordinated conveying between the warehouse and the main conveying line, a distributing module for controlling the shunting and the merging of a single verification unit 14, and a master control module for job scheduling and information monitoring, so as to achieve the following functions: the ordering, executing and scheduling of the electricity meter verification task, the balancing of jobs, the requesting of the meter box, the conveying of the meter box, the reading and determining of the meter box barcode, the feedback of the executing of the task, and the information collecting of the main conveying line 12 and the verification unit 14, which integrates the main conveying line 12, the warehouse and the verification units 14, thereby achieving the fully-automatic operation.

Figure 3:
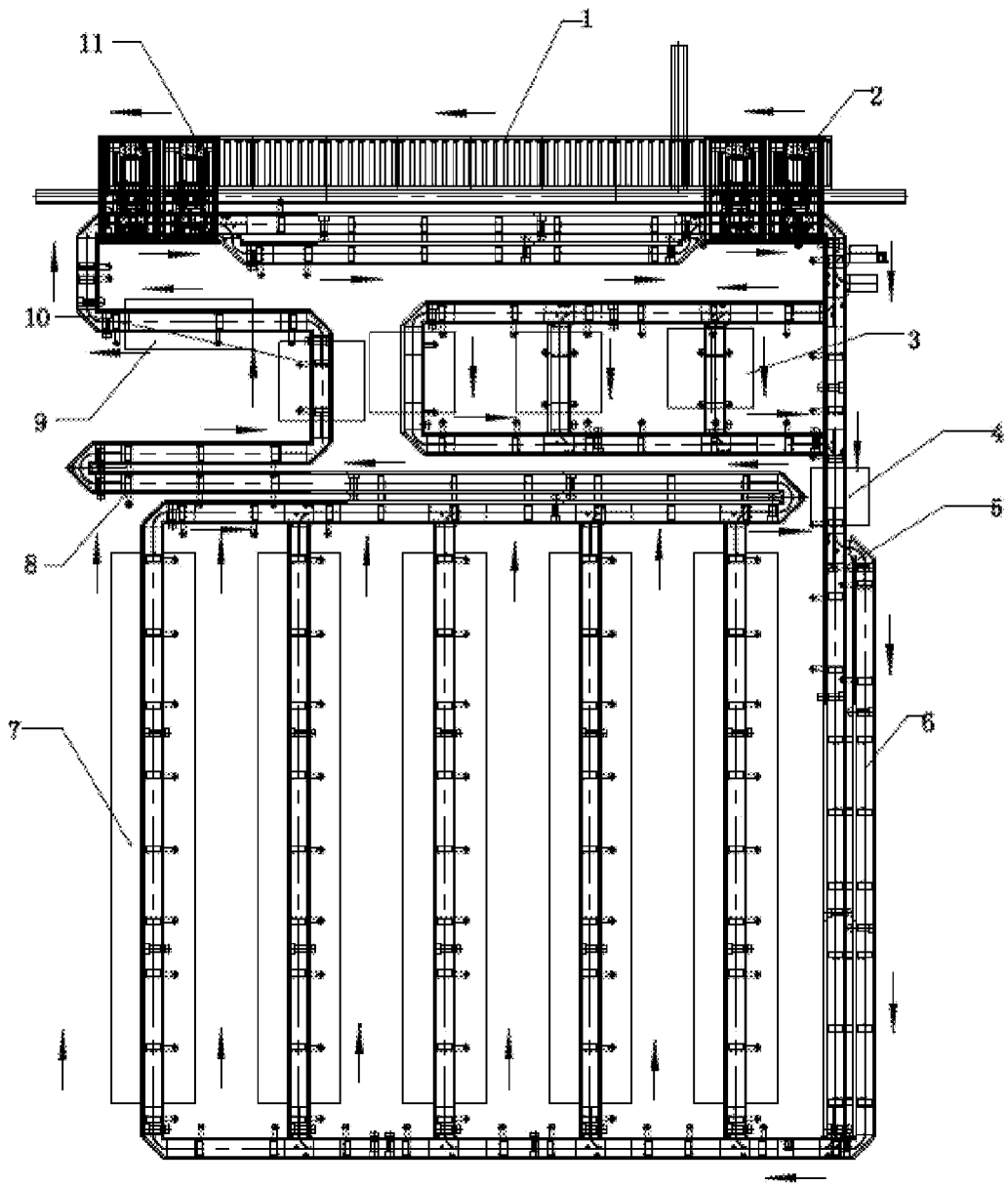
FIG. 3 is a structural schematic view of a verification unit for a single-phase electricity meter.
Figure 4:
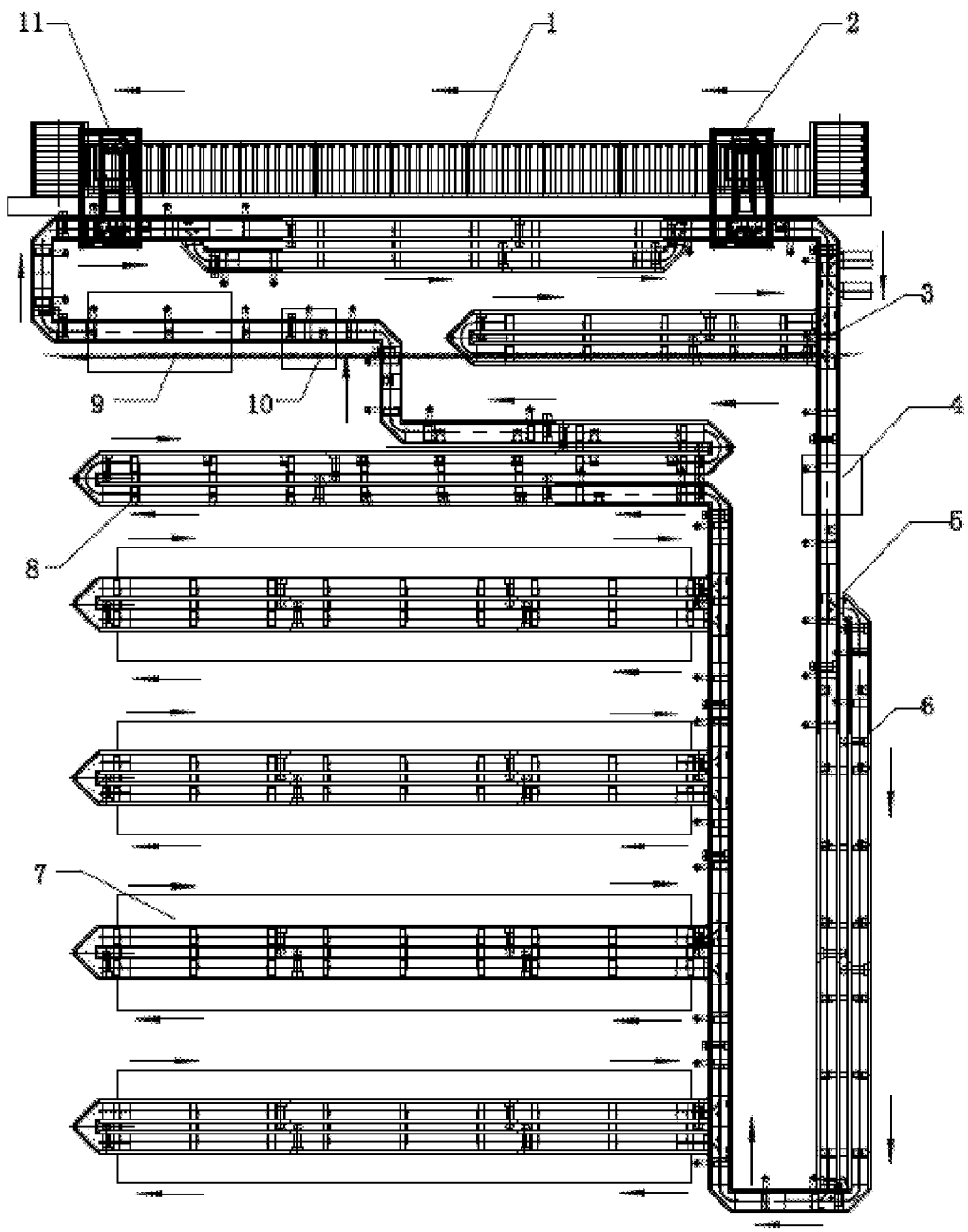
FIG. 4 is a structural schematic view of a verification unit for a three-phase electricity meter.

As shown in FIGS. 3 and 4, FIG. 3 is a structural schematic view of a verification unit for a single-phase electricity meter; and FIG. 4 is a structural schematic view of a verification unit for a three-phase electricity meter.

The verification unit 14 according to embodiments of the present application includes: a logistics conveying line 1 connected to the main conveying line 12 for conveying the turnover box; a loading device 2 located beside the loading station of the logistics conveying line 1, for moving the electricity meters located on the loading station of the logistics conveying line 1 to a verification conveying line 5; the verification conveying line 5 for moving the electricity meters to stations corresponded to various devices; a voltage-withstand testing device 3 for a high-voltage detection of the electricity meter; a programmable switch trigger device 4 for turning the cover of the electricity meter and pressing the programmable switch; a verification device 7 for verifying items of the electricity meter to be verified one by one; a lead sealing and laser marking device for the lead sealing and identification information recording of the qualified electricity meter; an unloading device 11 located beside the unloading station of the logistics conveying line 1, for transferring the electricity meter having been verified from the verification conveying line to the logistics conveying line 1; and a verification unit-management module 14 for the coordination among various devices, the logistics conveying line 1 and the verification conveying line 5, and the accurate sorting of the electricity meters based on information from the voltage-withstand testing device 3 and the verification device 7.

The loading device 2, the voltage-withstand testing device 3, the programmable switch trigger device 4, the verification device 7, the lead sealing and laser marking device 9, and the unloading device 11 are arranged along the advancing convey direction of the verification conveying line 5 sequentially.

In order to facilitate the person skilled in the art to understand the present application, the voltage-withstand testing device 3 will be described in detail in conjunction with FIGS. 5 to 7 hereinafter.

Figure 5:
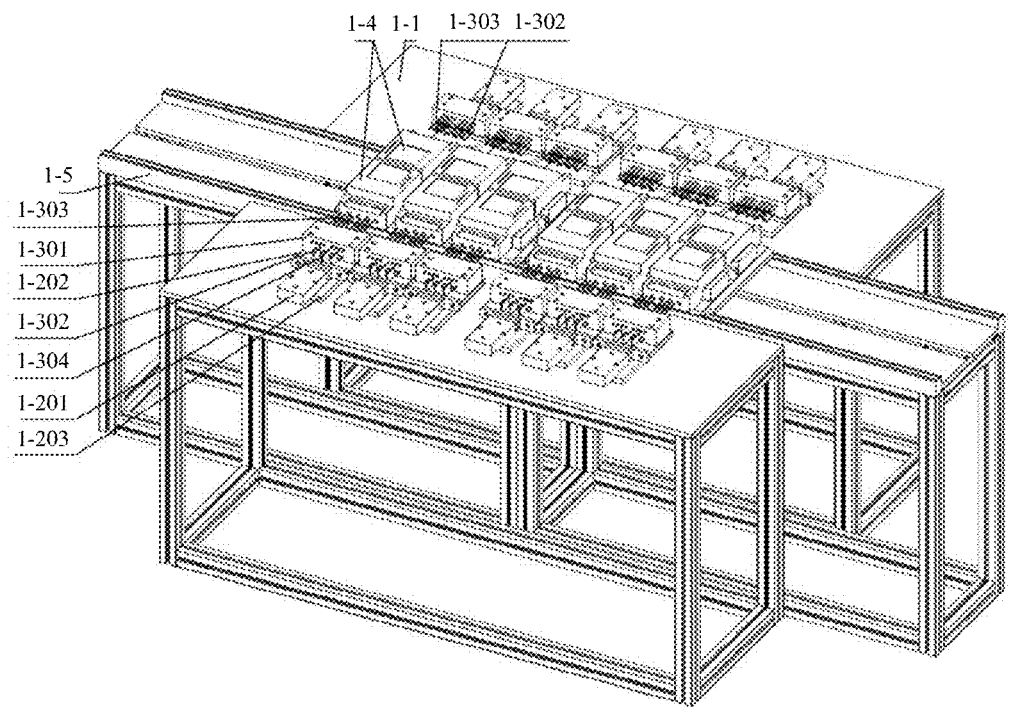
FIG. 5 is a structural schematic view of a voltage-withstand testing device according to the present application.
Figure 6:
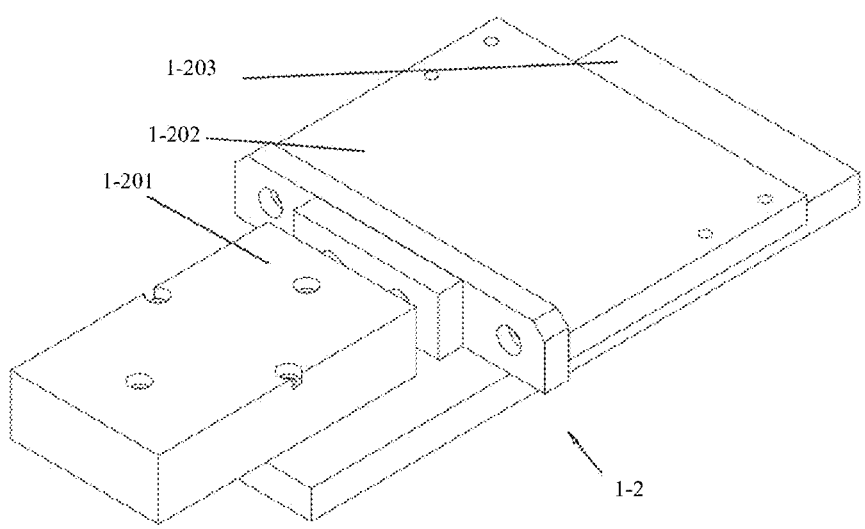
FIG. 6 is a structural schematic view of a connecting terminal according to an embodiment of the present application.
Figure 7:
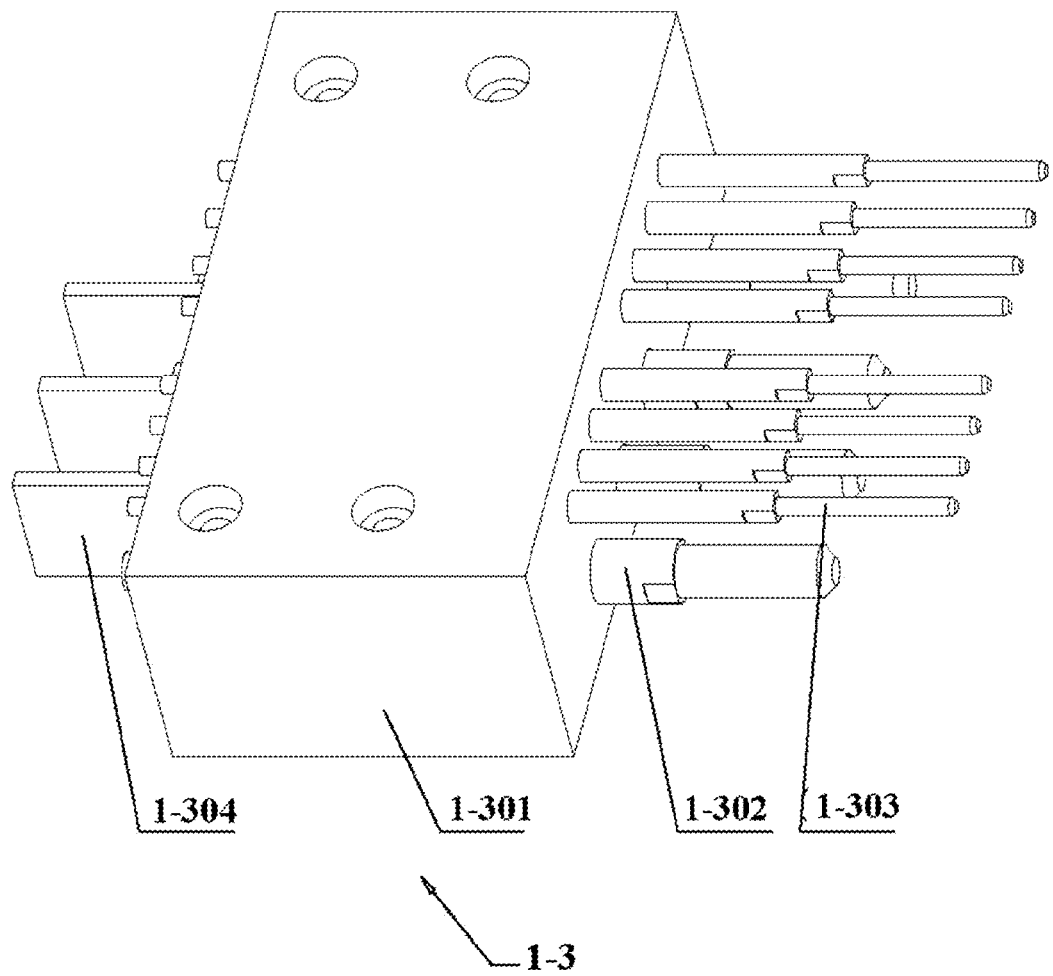
FIG. 7 a structural schematic view of a longitudinal crimp drive mechanism according to an embodiment of the present application.
Figure 8:
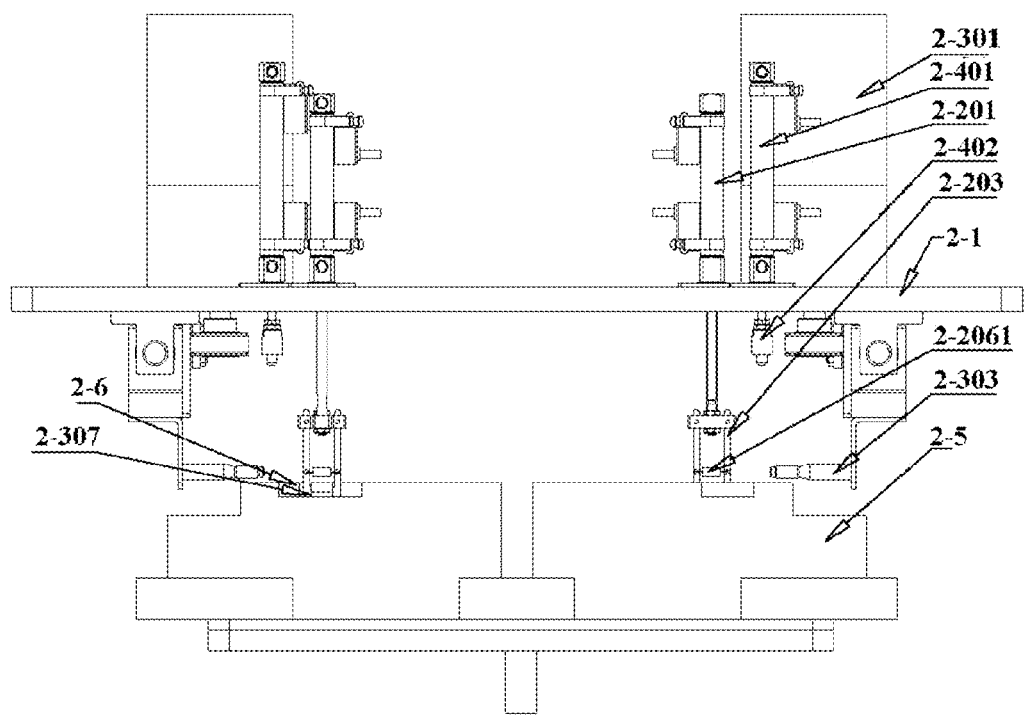
FIG. 8 is a structural schematic view of an automatic trigger device for an electricity meter programmable switch according to an embodiment of the present application in an operation state.
Figure 9:
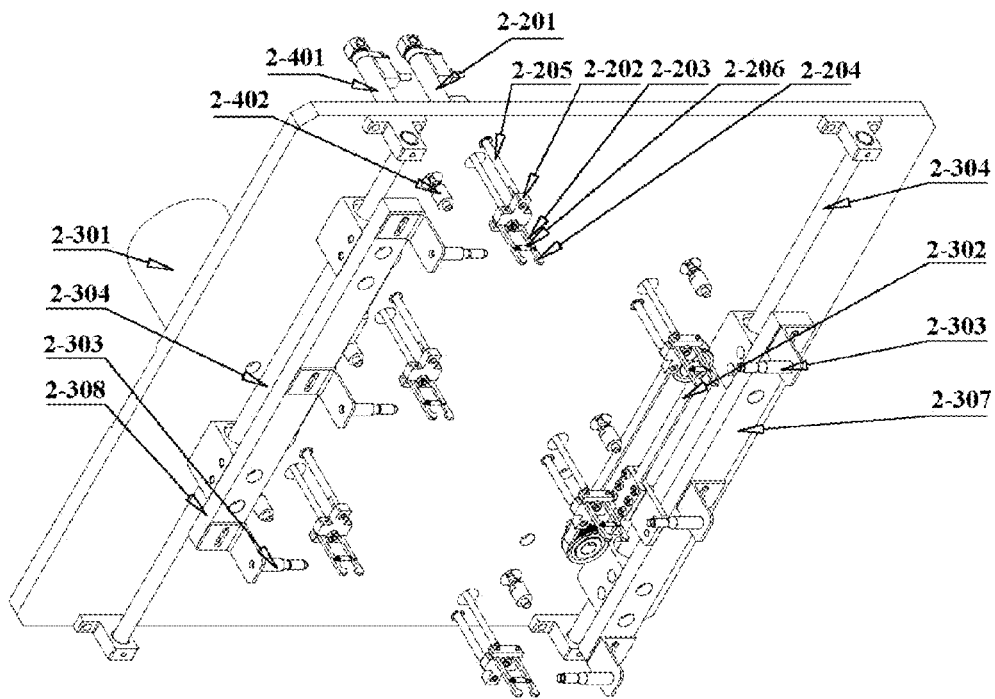
FIG. 9 is a bottom perspective structural schematic view of an automatic trigger device for an electricity meter programmable switch according to an embodiment of the present application.
Figure 10:
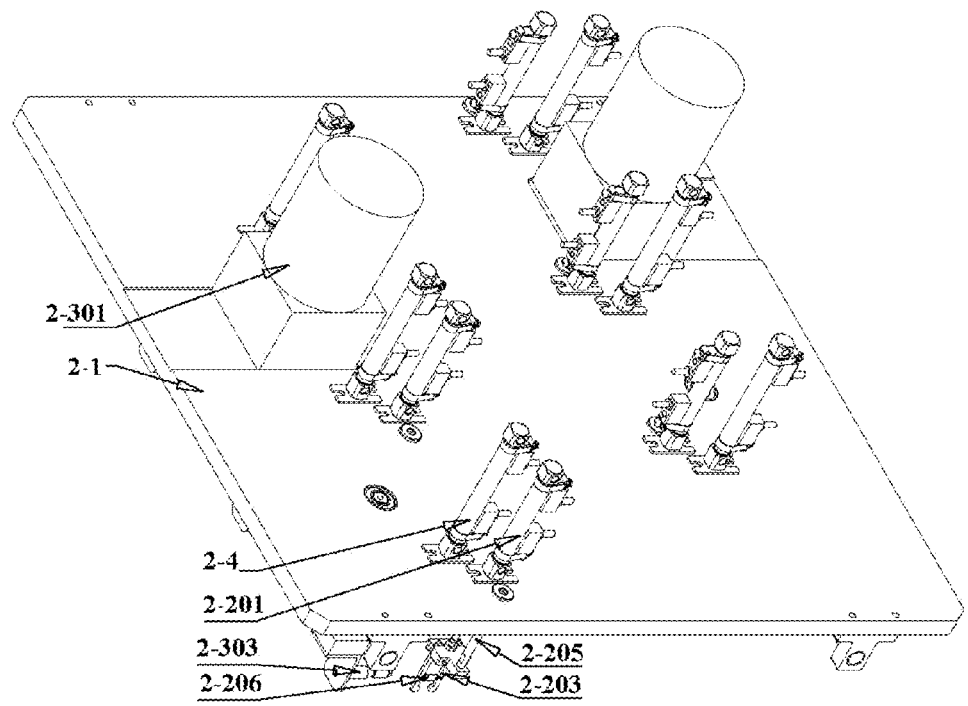
FIG. 10 is a top perspective structural schematic view of an automatic trigger device for an electricity meter programmable switch according to an embodiment of the present application.

As shown in FIGS. 5 to 7, the voltage-withstand testing device 3 according to the present application may include a voltage-withstand platform 1-1, a longitudinal crimp drive mechanism 1-2 provided on the voltage-withstand platform 1-1, a connecting terminal 1-3 connected to the longitudinal crimp drive mechanism 1-2 and is movable longitudinally, a drive control module connected to the longitudinal crimp drive mechanism 1-2 for controlling the longitudinal crimp drive mechanism 1-2, and a test module connected to the connecting terminal 1-3. The connecting terminal 1-3 includes a terminal block 1-301 connected to the longitudinal crimp drive mechanism and a plurality of probes passed through the terminal block 1-301. The probes include current probes 1-302 for supplying electric power to the electricity meter 1-4 and signal probes connected with the test module for transmitting detection information of the electricity meter 1-4.

In order to improve the operating efficiency and reduce the cost, one voltage-withstand platform 1-1 is provided with a plurality of stations (corresponding to the number of the electricity meters) and corresponding longitudinal crimp drive mechanisms 1-2.

As shown in FIG. 6, the longitudinal crimp drive mechanism 1-2 includes a cylinder 1-202 which has a piston rod, a dragging plate 1-202 connected with the piston rod, and a fixed plate 203 arranged below the dragging plate 1-202 and fixedly connected to the voltage-withstand platform 1-1. The cylinder 1-201 is arranged longitudinally, and the body of the cylinder 1-201 is fixedly connected to the fixed plate 203. The dragging plate 1-202 is slidably connected to the fixed plate 1-203.

As shown in FIG. 7, the terminal block 1-301 is provided with two rows of probe holes for the probes to pass through, among which the upper row of holes are signal probe holes, and the lower row of holes are voltage/current probe holes. Each of the signal probe holes and the voltage/current probe holes is provided with a buffer spring, with one end of the buffer spring abutting against the probe. The end of the terminal block 1-301 connected to the longitudinal crimp drive mechanism 1-2 is provided with a plurality of separating plates 1-304, with adjacent current probe holes being provided with one separating plate 1-304.

In order to improve the accuracy of the insertion of the probe, the voltage-withstand platform 1-1 is provided with a fixing device such that the voltage-withstand platform is fixedly connected to a conveying line frame 1-5.

The voltage-withstand testing process is as follows: after the electricity meter 1-4 is conveyed, via the conveying line, into the region of the voltage-withstand testing device for the electricity meter 1-4, the drive control module controls the cylinder 1-201 such that the piston rod is moved forward in a longitudinal direction, thereby driving the terminal block 1-301 fixedly connected to the dragging plate 1-202 to move forward, such that probes in the terminal block are inserted into the electricity meter 1-4. Then a high voltage is supplied via the voltage/current probes 1-302, and the signal probes 1-303 are connected to the ground, so as to perform the voltage-withstand testing of the electricity meter 1-4. After the voltage-withstand testing is finished, the qualified and unqualified electricity meters 1-4 are recorded by the test module, the drive control module controls the cylinder 1-201 such that the piston rod is retracted, and the dragging plate 1-202 is moved back longitudinally, thereby the probes are moved away from the electricity meter 1-4, and the longitudinal crimp drive mechanism 1-2 is returned back to its original position. Thereby the voltage-withstand testing is finished, and it is turn for the next set of electricity meters.

In order to facilitate the person skilled in the art to understand the present application, the programmable switch trigger device will be described in detail in conjunction with FIGS. 8 to 13 hereinafter.

The programmable switch trigger device 4 is an automatic trigger device for the programmable switch of the electricity meter.

As shown in FIGS. 8 to 13, the programmable switch trigger device 4 according to the present application includes a frame, a base plate 2-1 fixed to the frame, a cover-turning cylinder assembly 2-2 for turning the cover 2-6 of the electricity meter, a motor drive assembly 2-3 for increasing the angle that the cover 2-6 of the electricity meter is turned, and a button-pressing cylinder assembly 2-4 for pressing the programmable switch of the electricity meter 2-5. The cover-turning cylinder assembly 2-2, the motor drive assembly 2-3 and the button-pressing cylinder assembly 2-4 are provided on the base plate 2-1.

Figure 11:
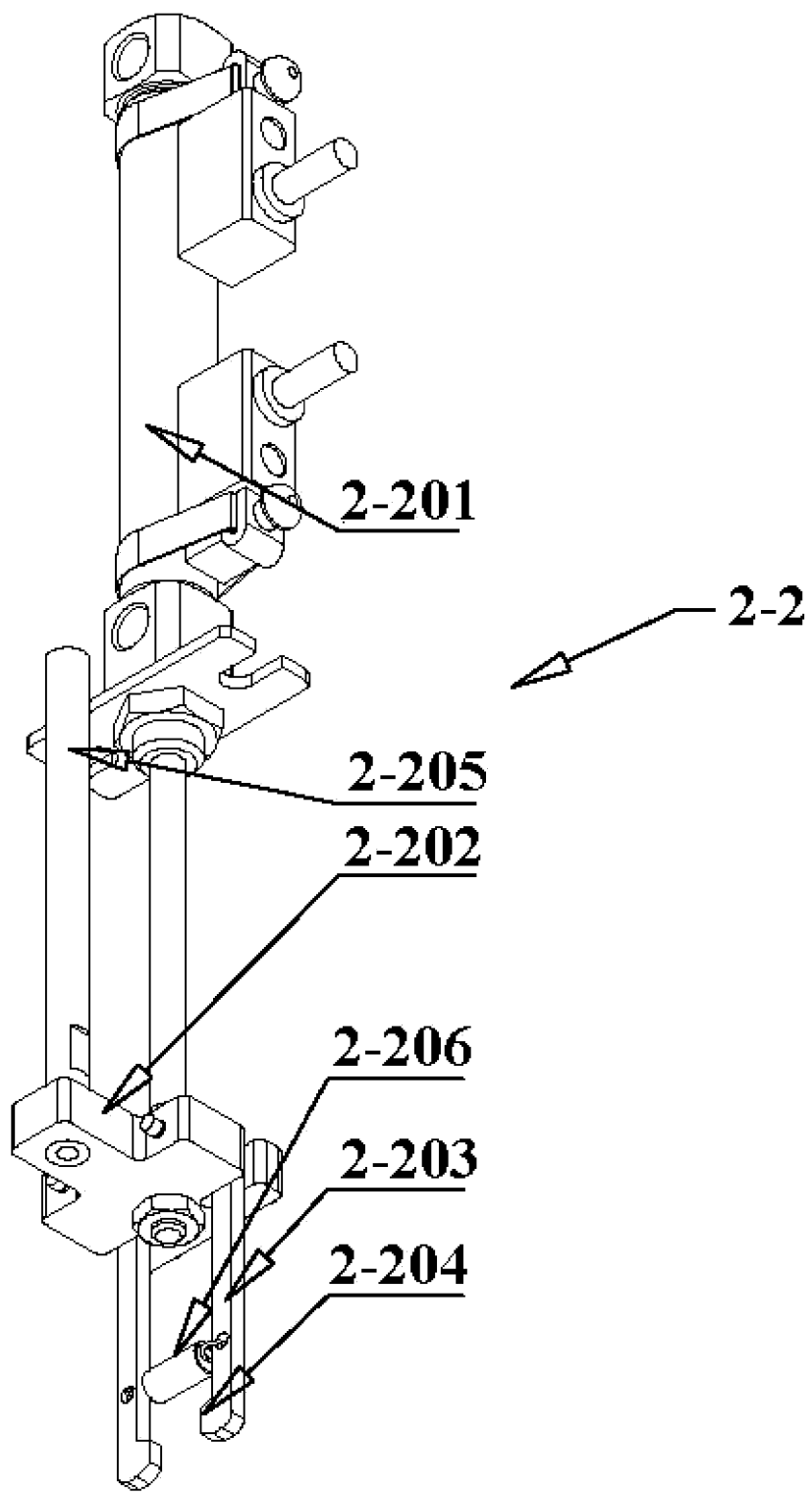
FIG. 11 is an exploded perspective schematic view showing a structure of a cover-turning cylinder assembly according to an embodiment of the present application.

As shown in FIG. 11, the cover-turning cylinder assembly 2-2 includes: a cover-turning cylinder 2-201, the cylinder body of the cover-turning cylinder 2-201 is fixed to the base plate 2-1 and the piston rod of the same is passed through the base plate 2-1 downwardly; a cylinder seat 2-202 connected to the end portion of the piston rod of the cover-turning cylinder 2-201; two clamping jaws 2-203 pivotally connected to the cylinder seat 2-202; and a guide post 2-205 parallel to the piston rod of the cover-turning cylinder 2-201. The clamping jaw 2-203 is provided with a hook portion 2-204, the hook portion has an inclined surface for insertion, and hook portions 2-204 of the two clamping jaws 2-203 are provided opposite to each other. The guide post 2 -205 is fixedly connected to the cylinder seat 2-202 after passed through a guide hole on the base plate 2-1. An elastic pulling member 2-206 is provided between the two clamping jaws 2-203, such that the two clamping jaws 2-203 are pulled inwardly to hook the cover 2-6.

Figure 12:
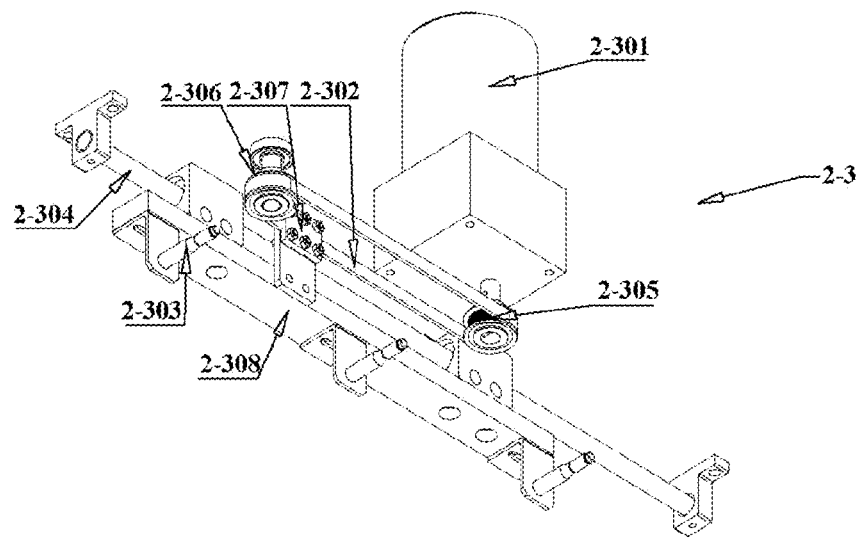
FIG. 12 is a structural schematic view of a motor drive assembly according to the present application.

As shown in FIG. 12, the motor drive assembly 2-3 includes a motor 2-301, a belt 2-302 which is driven by the motor 2-301 and is movable forward and backward, a roller 2-303 for contacting with the inner side of the cover 2-6 to change the angle that the cover is turned, a driving frame 2-304 connecting the belt 2-302 with the roller 2-303, a driving wheel 2-305 connected to the motor 301, and a driven wheel 2-306 pivotally connected to the base plate 2-1. The driving wheel 2-305 and the driven wheel 2-306 are arranged from front to rear. The motor 2-301 is vertically fixed on the base plate 2-1, and the shaft of the motor 2-301 is passed through the base plate 2-1 and is connected to the driving wheel 2-305. The belt 2-302 is sleeved on the peripheries of the driving wheel 2-305 and the driven wheel 2-306. The driving wheel 2-305 and the driven wheel 2-306 are toothed wheels, and the belt 2-302 is a synchronous toothed belt cooperated with the toothed wheels. The upper and lower end portions of each of the driving wheel 2-305 and the driven wheel 2-306 are provided with outwardly protruded disc-shaped limiting members 2-406. The driving frame 2-304 includes a clamping portion 2-307 cooperated with the belt 2-302, a moving frame 2-308 which is fixedly connected to the clamping portion 2-307 and has a guide hole, and a guide rod 2-304 cooperated with the guide hole of the moving frame 2-308 and fixed to the base plate 2-1 in the front and rear direction. The roller 2-303 includes a rigid shaft body at the middle portion and a flexible protective sleeve sleeved on the shaft body, and the shaft body of the roller 2-303 is vertically and pivotally connected to the moving frame 2-308. In order to improve the utilization ratio of the apparatus, a plurality of rollers 2-303 are provided on the moving frame 2-308 so as to operate corresponding number of electricity meters 2-5 simultaneously.

Figure 13:
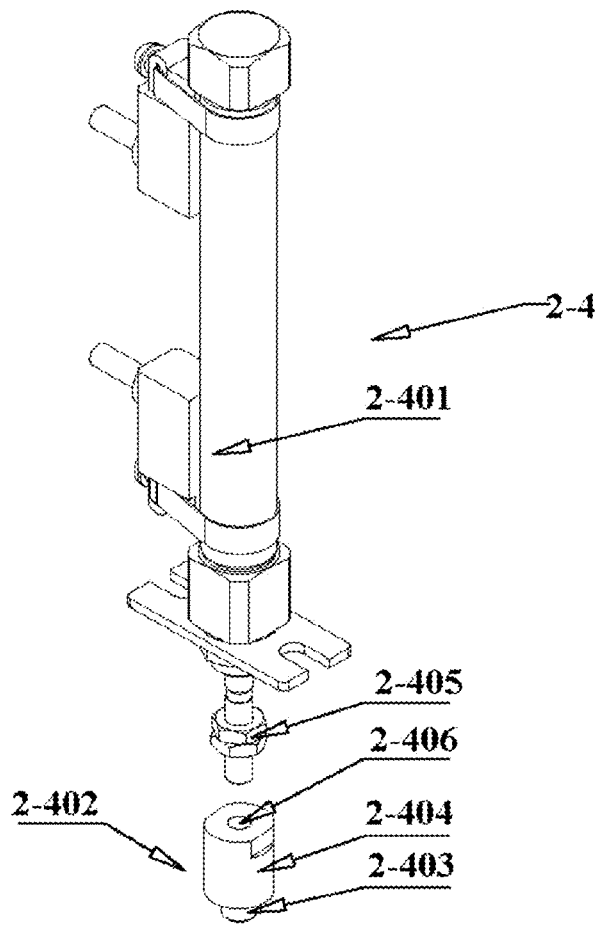
FIG. 13 is a structural schematic view of a button-pressing cylinder assembly according to an embodiment of the present application.

As shown in FIG. 13, the button-pressing cylinder assembly 2-4 includes: a button-pressing cylinder 2-401, the cylinder body of the button-pressing cylinder is fixed to the base plate 2-1 and the piston rod of the same is passed through the base plate 2-1 downwardly; and a pressing head 2-402 provided at the lower end portion of the piston rod of the button-pressing cylinder 2-401. The pressing head 2-402 is an elastic pressing head 2-402 which includes a pressing portion 2-403 and a mounting portion 2-404 having a diameter larger than that of the pressing portion 2-403. The mounting portion 2-404 is provided with an insertion hole 2-405 cooperated with the piston rod of the button-pressing cylinder, and the diameter of the insertion hole 2-405 is less than that of the piston rod of the button-pressing cylinder. A limiting member 2-406, the upper and lower fixed positions of which is adjustable, is provided on the piston rod of the button-pressing cylinder. The limiting member 2-406 may be a nut, and the piston rod of the button-pressing cylinder is provided with threads such that two nuts are threaded on the piston rod, the two nuts serve as the limiting member 2-406 after being screwed to each other, so as to avoid the circumstance that the elastic pressing head 2-402 can not press the programmable switch since the elastic pressing head is upwardly retracted under the pressing force continually.

In order to reduce the cost, a plurality of cover-turning cylinder assemblies 2-2, motor drive assemblies 2-3 and button-pressing cylinder assemblies 2-4 are provided on one base plate 2-1. In the present application, six cover-turning cylinder assemblies 2-2, two motor drive assemblies 2-3 and six button-pressing cylinder assemblies 2-4 are provided on one base plate 2-1; three rollers 2-303 arranged from front to rear are provided on the moving frame 2-308 of one driving assembly; and the cover-turning cylinder assemblies 2-2, the motor drive assemblies 2-3 and the button-pressing cylinder assemblies 2-4 are symmetrically provided at two sides of the base plate 2-1. Thereby six electricity meters 2-5 are operated, which ensures the operation efficiency and reduces the cost. Positions of the cover-turning cylinder assembly 2-2, the motor drive assembly 2-3 and the button-pressing cylinder assembly 2-4 of the programmable switch-automatic trigger device of a single electricity meter are based on the structure and the position of the electricity meter 2-5, and in FIGS. 8, 9 and 10, the cover-turning cylinder 2-201 is located behind the button-pressing cylinder 2-401.

The automatic trigger process of the programmable switch of the electricity meter includes the following steps:

1) Initially turning of the cover 2-6. When the electricity meter 2-5 is moved to the programmable switch automatic trigger device and is energized, the piston rod of the cover-turning cylinder 2-201 is moved downward, the clamping jaw 2-203 at the lower end of the piston rod clamps the lead sealing side of the cover 2-6 of the programmable switch of the electricity meter 2-5. Then the piston rod of the cover-turning cylinder 2-201 is moved upward such that the clamping jaw 2-203 is raised, thereby the cover 2-6 is pulled at a certain angle.

2) Continually turning of the cover 2-6. The motor drive assembly 2-3 is operated, and the motor 2-301 is rotated to drive the belt 2-302 to move forward. The roller 2-303 is moved forward together with the belt 2-302. The roller 2-303 is brought into contact with the inner side of the cover 2-6 as it is moved forward. The cover 2-6 is turned continually and is moved away from the clamping jaw 2-203 with the forward moving of the roller 2-303. The motor 2-301 is stopped until the cover 2-6 is turned to the vertical direction, making way for the programmable button.

3) Pressing the programmable switch. The piston rod of the button-pressing cylinder 2-401 is moved downward such that the pressing head 2-402 presses the button of the programmable switch of the electricity meter 2-5. After then the piston rod of the button-pressing cylinder 2-401 is moved upward such that the pressing head 2-402 is moved away from the electricity meter 2-5.

4) Returning the cover 2-6 to its original position. The motor drive assembly 2-3 is operated, and the motor 2-301 is rotated reversely to drive the belt 2-302 to move backward. The roller 2-303 is moved backward together with the belt 2-302. The cover 2-6 is turned reversely because of the backward movement of the roller 2-303 as the roller 2-303 is moved backward. In a case that the roller 2-303 is moved backward continually and is away from the cover 2-6 of the electricity meter, the cover 2-6 falls and returns to its original position. At this time, the automatic trigger of the programmable switch of the electricity meter is completed.

The verification unit 14 further includes a charge controlling and parameter setting device 10, an appearance inspecting device for taking pictures of the appearance and the display screen of the electricity meter and performing corresponding processes, an unloading temporary storage area 8 located between the unloading device 11 and the verification device 7 for temporarily storing the electricity meter having been detected so as to achieve the ordered control of the streamline, a loading temporary storage area 6 located between the voltage-withstand testing device 3 and the verification device 7 for temporarily storing the electricity meter to be tested, and a turnover box temporary storage area located between the loading device 2 and the unloading device 11 for conveying the empty turnover box at the loading station to the unloading station and temporarily storing the same. The turnover box temporary storage area is provided with a turnover box conveying line and a turnover box protecting mechanism.

The charge controlling and parameter setting device 10 includes: a main control module for automatically changing the card; an analog card which can be inserted into a card slot of the electricity meter being tested; an analog card drive mechanism connected with the analog card for driving the analog card to move up and down, so as to achieve the insertion and removal of the analog card; a card reading module for reading the information of the electricity meter being tested; an analog card contact determining module for determining the contact information of the analog card based on the information read from the card; and an automatic card changing control module for controlling a Single-Chip Microcomputer (SCM) to change the card.

The programmable switch trigger unit includes a power supply for supplying power to the electricity meter, a cover-opening mechanism for opening the cover of the electricity meter and a programmable switch-pressing mechanism for pressing the programmable switch.

The turnover box temporary storage area is provided with a turnover box conveying line and a turnover box protecting mechanism.

The appearance inspecting device is provided on the station at which the voltage-withstand testing device 3 or the verification device 7 is located.

The verification conveying line 5 includes a frame, a driving motor provided on the frame for driving the belt to move forward, a belt conveyor connected to a rotary shaft of the driving motor, a stopping mechanism provided on the frame for accurately stopping the pallet on the belt conveyor, a counter provided on the frame for counting the electricity meter, a barcode scanner provided on the frame for recording the information of the electricity meter, and a sorting mechanism for sorting the electricity meter.

In order to increase the verification efficiency, each verification unit 14 is provided with a plurality of verification branches arranged in parallel. The electricity meters on the verification conveying line 5 are shunted to the verification branches, and the verification branch is provided with the verification device 7, thereby a plurality of electricity meters on the verification branches can be verified simultaneously.

The beginning and the end of the verification conveying line 5 are connected with each other, and the verification conveying line 5 is provided with pallets which are cooperated with the verification conveying line 5 and configured for carrying the electricity meters, such that the electricity meters are sequentially conveyed to the stations at which the voltage-withstand testing device 3, the verification device 7, and the lead sealing and laser marking device 9 are located, to thereby finish the transport task for the online verification of all the items of the electricity meter.

A pallet temporary storage area is provided on the verification conveying line 5 between the unloading device 11 and the loading device 2 for temporarily storing the pallet, so as to respond to the loading requirement of the loading device 2 timely.

Figure 16:
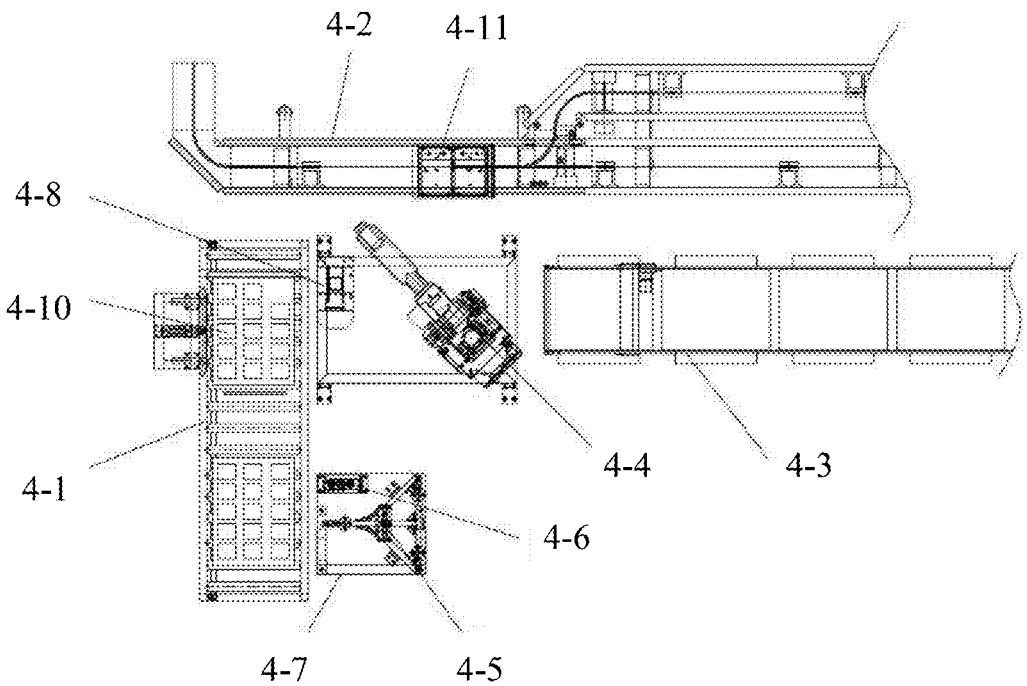
FIG. 16 is a structural schematic view of a robot loading-unloading device for an electricity meter according to an embodiment of the present application.
Figure 17:
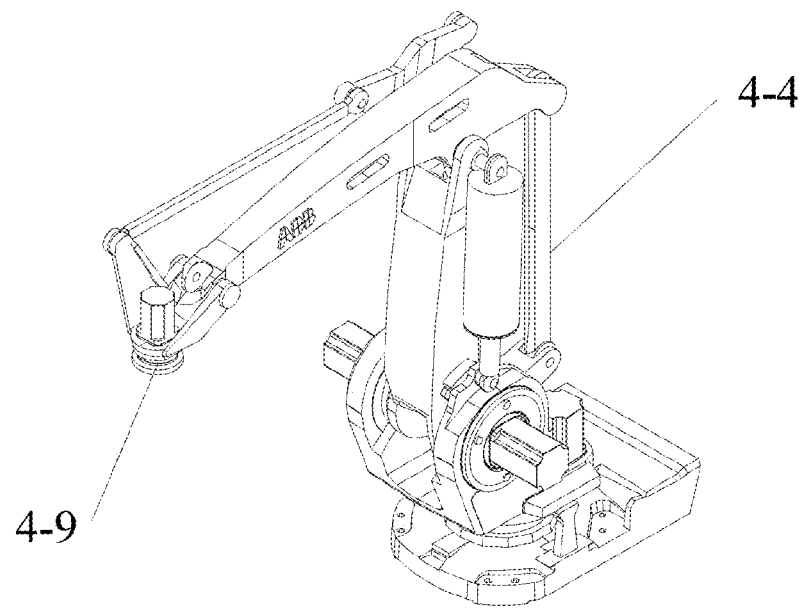
FIG. 17 is a structural schematic view of a robot arm according to an embodiment of the present application.
Figure 18:
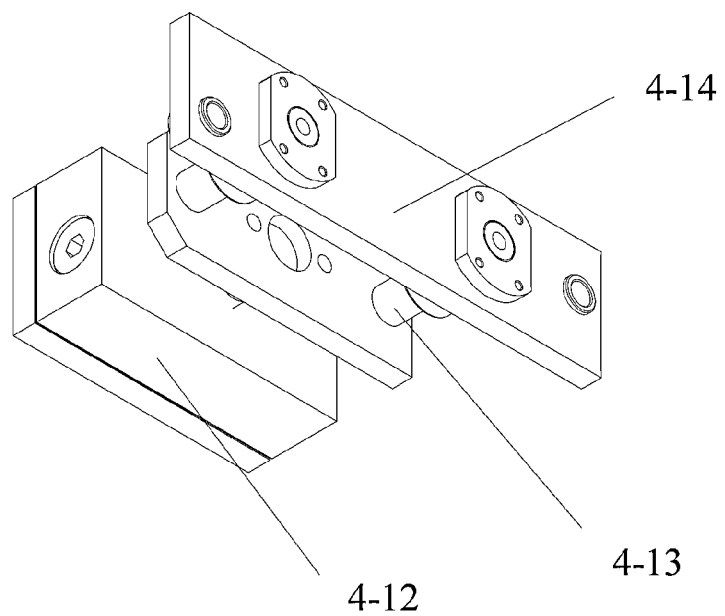
FIG. 18 is a structural schematic view of a sucking disc for an electricity meter according to an embodiment of the present application.
Figure 19:
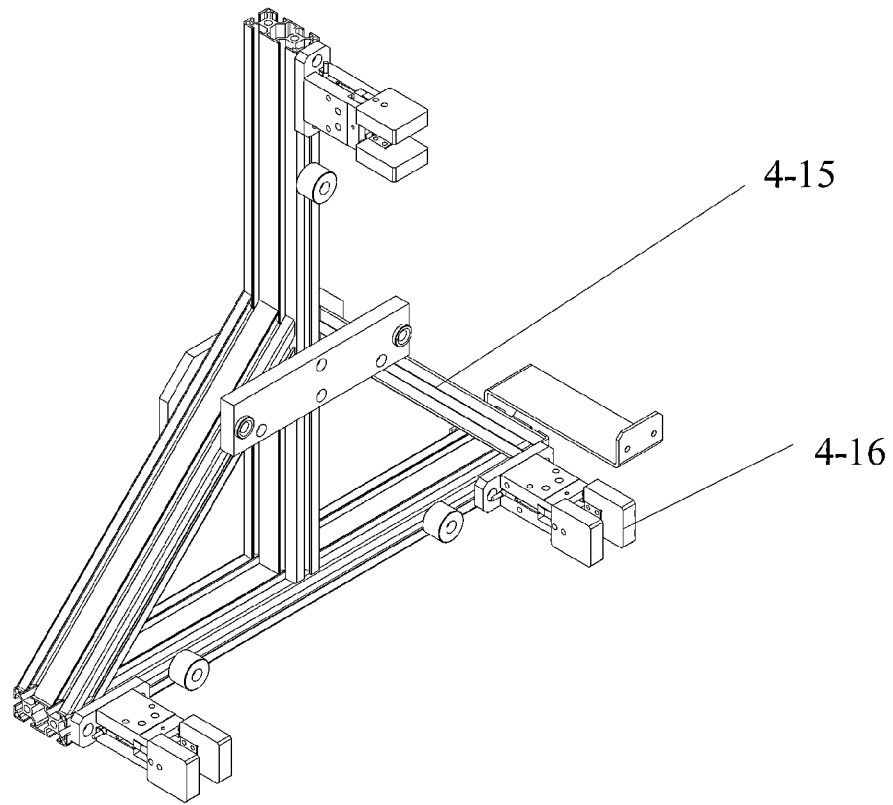
FIG. 19 is a structural schematic view of a carton clamp according to an embodiment of the present application.
Figure 20:
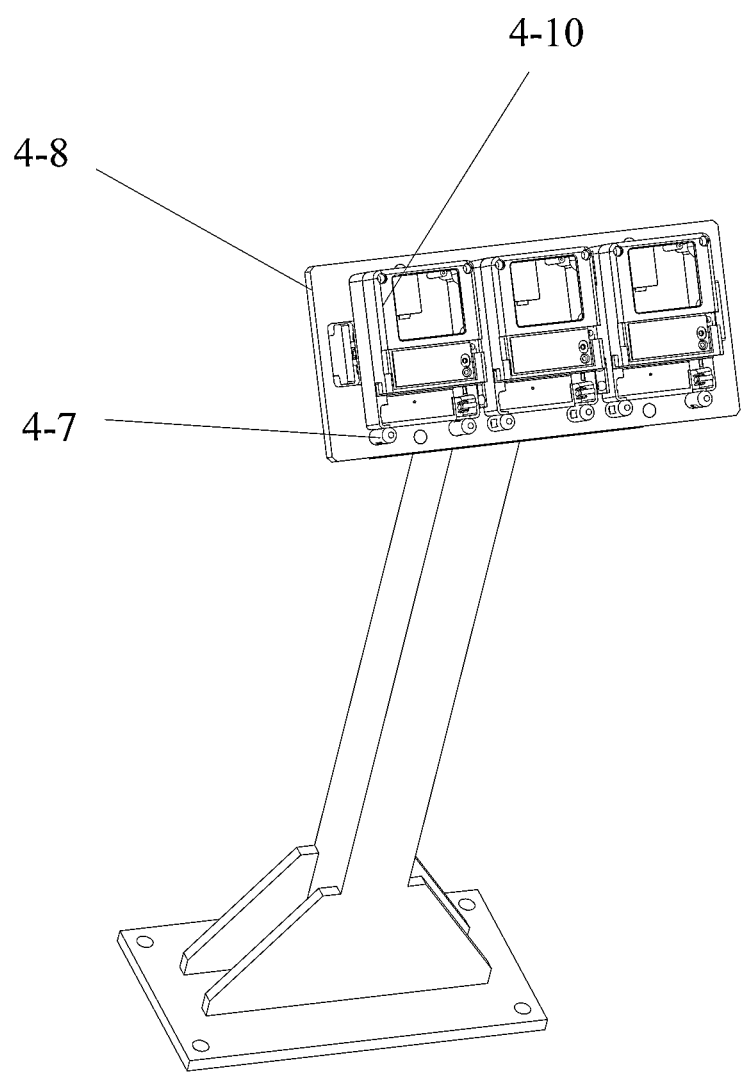
FIG. 20 is a structural schematic view of a transfer platform according to an embodiment of the present application.

The loading device 2 includes a loading robot. The loading robot is configured for accurately placing the electricity meter, which is to be verified and located on the logistics conveying line 1 so as to be conveyed to the unloading station, onto the pallet on the verification conveying line 5 and grabbing the turnover material box onto the empty box temporary storage chain 4-3 (FIG. 16), and the loading robot includes a loading robot arm, a controller for controlling the robot arm to act, and a loading clamp connectable to the lower end of the robot arm.

The unloading device 11 includes an unloading robot for grabbing the turnover box onto the empty box temporary storage chain 4-3 (FIG. 16) onto the logistics conveying line 1 and placing the tested electricity meter on the pallet on the verification conveying line 5 into the turnover material box.

The unloading robot includes an unloading robot arm, a controller for controlling the action of the robot arm, and an unloading clamp connectable to the lower end of the unloading robot arm.

The loading robot is provided with a locating platform for accurately locating the electricity meter. The loading robot arm grabs the electricity meter on the logistics conveying line 1 and places the same on the locating platform such that the electricity meter is located, then the loading robot arm grabs the electricity meter again and places the same on the pallet located on the verification conveying line 5.

In order to facilitate the person skilled in the art to understand the present application, the robot loading-unloading device for the electricity meter will be described in detail in conjunction with FIGS. 16 to 20 hereinafter.

As shown in FIGS. 16 to 20, the robot loading-unloading device for the electricity meter according to the present embodiment includes:

a meter box conveying chain 4-1, a pallet conveying chain 4-2 and an empty box temporary storage chain 4-3. A multi-axis linkage robot arm 4-4 may be provided among the three chains.

The robot arm 4-4 may be provided with a connection joint 4-9, and a carton clamp 4-5 and an electricity meter sucking disc 6 are respectively provided with a connection interface cooperated with the connection joint 4-9.

The carton clamp 4-5 and the electricity meter sucking disc 4-6 are arranged on a replacement platform 4-7. An electricity meter transfer platform 4-8 is provided at a side of the robot arm 4-4.

The transfer platform 4-8, the meter box conveying chain 4-1, the pallet conveying chain 4-2 and the empty box temporary storage chain 4-3 may be arranged at four sides of the robot arm, respectively. The pallet 4-11 is conveyed on the pallet conveying chain 4-2.

The transfer platform 4-8 may be provided with a plurality of electricity meter locating protrusions, and the shape formed by the locating protrusions may receive three single-phase electricity meters or one three-phase electricity meter 4-10.

The electricity meter sucking disc 4-6 may include a fixing plate 4-14, a buffer member 4-13 and a sponge sucking disc 4-12. One side of the fixing plate 4-14 is fitted with a connection interface, and the other side of the fixing plate 4-14 is fitted with the buffer member 4-13. The sponge sucking disc 4-12 is mounted at an outer side of the buffer member 4-13. There may be a plurality of sponge sucking discs which are arranged in parallel, for sucking a relatively large electricity meter.

The carton clamp 4-5 may include a clamp frame 4-15. One side of the clamp frame 4-15 is fitted with a connection interface, and the other side thereof is provided with a plurality of pneumatic clamping jaws 4-16.

There may be three pneumatic clamping jaws 4-16 which are arranged on the clamp frame 4-15 in a triangle shape, and two of the pneumatic clamping jaws have the same clamping direction. The robot arm 4-4 is a six-axis linkage robot whose model may be Yaskawa motoman-mh6. There are many robots having similar functions on the market, and description thereof is omitted.

The verification device 7 includes a frame, a longitudinal crimp drive mechanism provided on the frame, a connecting terminal which is connected with the longitudinal crimp drive mechanism and is movable longitudinally, a drive control module connected with the longitudinal crimp drive mechanism for controlling the longitudinal crimp drive mechanism to act and a test module connected with the connecting terminal. The connecting terminal includes a terminal block connected with the longitudinal crimp drive mechanism, and a plurality of probes passed through the terminal block. The probe includes strong and weak electricity pins for connecting the electricity meter. The verification device is provided with a program-controlled power source connected with the strong and weak electricity terminals of the electricity meter for providing voltage and current, and a verification platform fixed to the frame. The longitudinal crimp drive mechanism of the verification device is provided on the voltage-withstand platform.

In order to facilitate the person skilled in the art to understand the present application, the pallet will be described in detail in conjunction with FIGS. 21 to 24 hereinafter.

Figure 23:
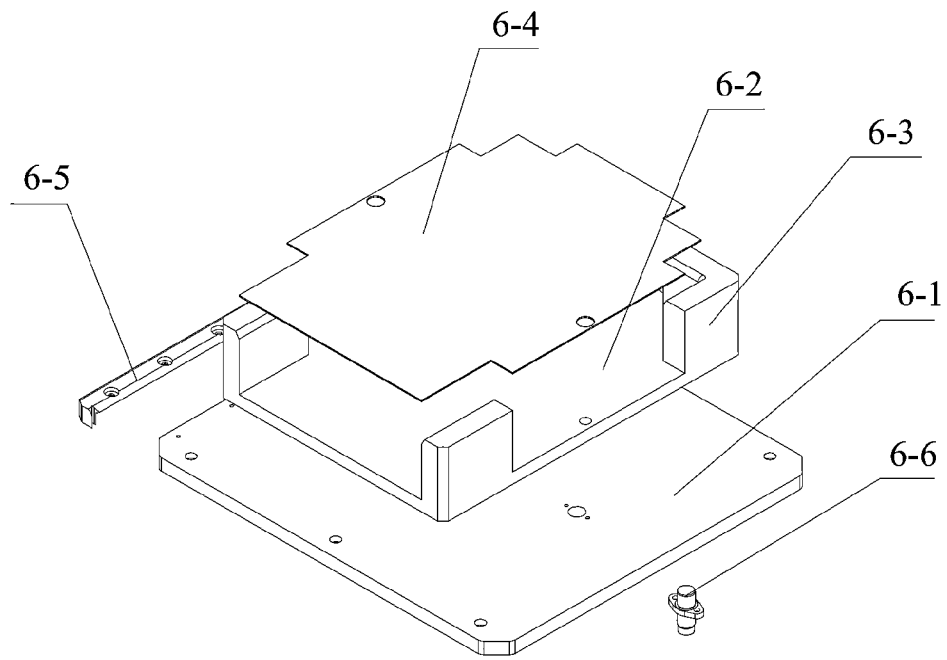
FIG. 23 is an exploded structural schematic view of a single-position pallet for the online detection of the electricity meter according to an embodiment of the present application.

As shown in FIG. 23, the single-position pallet for the online detection of the electricity meter according to embodiments of the present application includes a bottom plate 6-1. A locating insulation plate 6-2 is mounted on the upper surface of the bottom plate 6-1, and a plurality of protrusions 6-3 are provided on the periphery of the locating insulation plate 6-2. A conductive metal layer 6-4 is mounted on the upper surface of the locating insulation plate 6-2. A collision buffer bar 5 is mounted at a side wall of the bottom plate 6-1, and a guide member 6-6 is mounted at the lower surface of the bottom plate 6-1.

The locating insulation plate 6-2 has a rectangular shape. The protrusions 6-3 are provided at corners of the locating insulation plate 6-2. The bottom plate 6-1 is a rectangular plate. The collision buffer bar 6-5 has an elongate shape and has a plurality of mounting holes which are arranged evenly. The locating insulation plate 6-2 is arranged in parallel with a side edge of the bottom plate 6-1. The collision buffer bar 6-5 is arranged on the side edge of the bottom plate 6-1 parallel to the long sides of the locating insulation plate 6-2. The guide member 6-6 includes two guide shafts arranged symmetrically and bearings arranged at the lower end of the guide shafts.

The pallet is conveyed by the conveying line which applies a convey power to the bottom plate 6-1 such that the bottom plate is moved forward. The guide member performs the guiding of straight forward moving, turning and other actions. When the pallet is conveyed to the predetermined position, the guide shaft is stopped by the stopping mechanism, causing the pallet being accurately located. The conductive metal layer 6-4 is directly connected to the ground by an auxiliary grounding mechanism in the voltage-withstand testing, while the locating insulation plate 6-4 prevents the situation that the high voltage generated in the voltage breakdown being directly applied to the verification conveying line.

Figure 24:
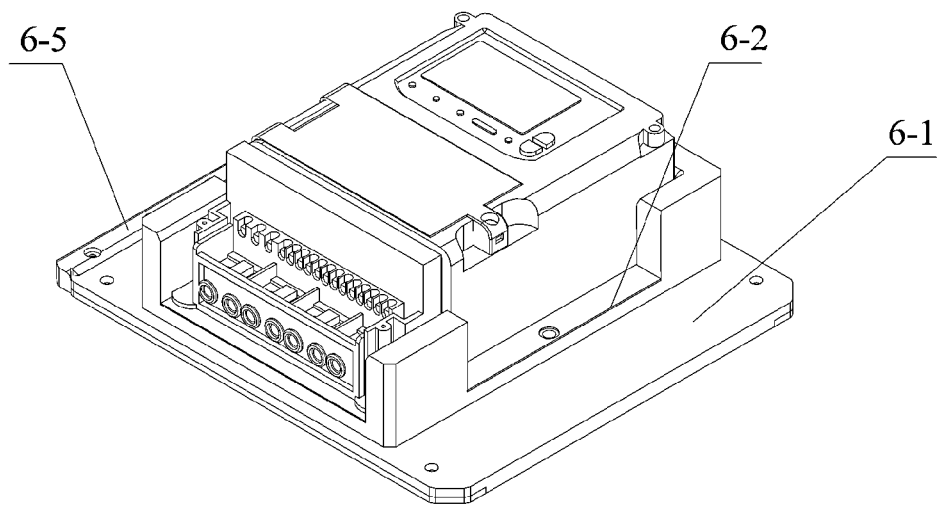
FIG. 24 is an exploded structural schematic view of a single-position pallet for the online detection of the electricity meter according to an embodiment of the present application.

As shown in FIG. 24, one three-phase electricity meter is placed on a single-position pallet for the online detection of the electricity meter.

Figure 21:
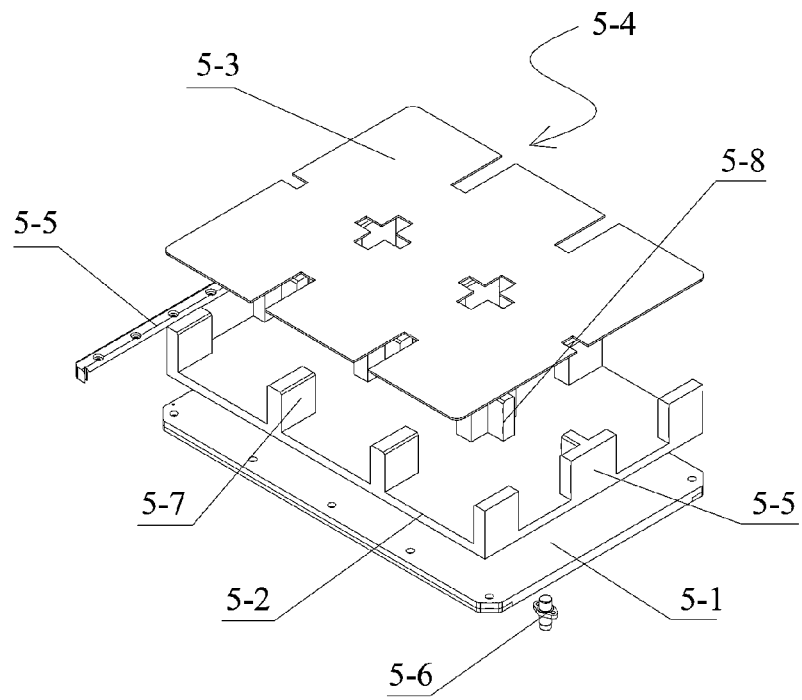
FIG. 21 is an exploded structural schematic view of a multi-position pallet for the online detection of the electricity meter according to an embodiment of the present application.

As shown in FIG. 21, the multi-position pallet for the online detection of the electricity meter according to embodiments of the present application includes a bottom plate 5-1. A locating insulation plate 5-2 is mounted on the upper surface of the bottom plate 5-1, and rows of spaced protrusions are provided on the locating insulation plate 5-2. The protrusions include protrusions 5-7 provided on and being perpendicular to the side edge of the locating insulation plate 5-2 and have a shape of Chinese character "一", and protrusions 5-8 provided on the middle portion of the locating insulation plate 5-2 and have a shape of Chinese character "十". A conductive metal layer 5-3 is mounted on the upper surface of the locating insulation plate 5-2. A guide member 5-6 is mounted at the lower surface of the bottom plate 5-1.

A T-shaped protrusion 5-9, which is aligned with the protrusions 5-8 having the shape of Chinese character "十", is provided at the edge portion of the locating insulation plate 5-2, and the transverse side of the T-shaped protrusion 5-9 is superposed on the side edge of the locating insulation plate 5-2. The bottom plate 5-1 is a rectangular plate, and a collision buffer bar 5-5 is mounted at the side wall of the bottom plate 5-1. The collision buffer bar 5-5 has an elongate shape and has a plurality of mounting holes which are arranged evenly. The locating insulation plate 5-2 is arranged in parallel with the side edge of the bottom plate 5-1, and the collision buffer bar 5-5 is arranged on the side edge of the bottom plate 5-1 parallel to the long side of the locating insulation plate 5-2. The guide member 5-6 includes two symmetrical guide shafts and bearings arranged at the lower end of the guide shafts. The conductive metal layer 5-3 is a plate on which through holes 5-4 cooperated with the protrusions are provided.

Two rows of electricity meters 5-10 may be placed on the pallet and then conveyed on the conveying line. The convey power is applied to the bottom plate 5-1 such that it is moved forward. The guide member 5-6 performs the guiding of straight forward moving, turning and other actions. When the pallet is conveyed to the predetermined position, the guide shaft is stopped by the stopping mechanism, causing the pallet being accurately located. The conductive metal layer 5-3 is directly connected to the ground by an auxiliary grounding mechanism in the voltage-withstand testing, while the locating insulation plate 5-3 prevents the situation that the high voltage generated in the voltage breakdown directly applied to the verification conveying line body.

Figure 22:
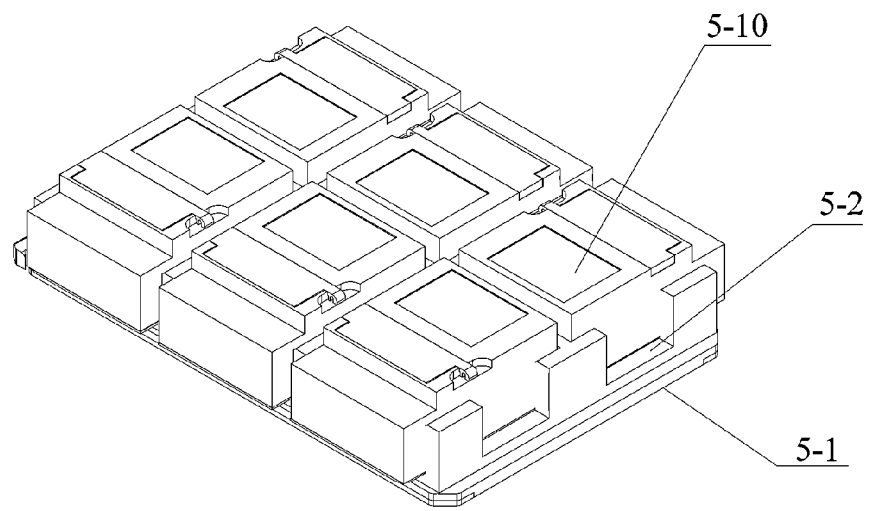
FIG. 22 is a structural schematic view of the multi-position pallet for the online detection of the electricity meter according to the embodiment of the present application on which electricity meters are mounted.

As shown in FIG. 22, six single-phase electricity meters 5-10 are placed on the multi-position pallet for the online detection of the electricity meter.

Since the three-phase electricity meter has larger weight and volume than the single-phase electricity meter, two three-phase electricity meters or six single-phase electricity meters may be arranged on one pallet. In order to reduce the area occupied by the verification unit 14, as shown in FIG. 3, a verification branch having a shape of Chinese character "一" may be employed for the fully-automatic verification of the single-phase electricity meter, and as shown in FIG. 4, a U-shaped annular verification branch may be employed for the fully-automatic verification of the three-phase electricity meter.

The operation process of the fully-automatic verification system for the smart electricity meter are as follows:

The electricity meter to be verified is conveyed into the supplying temporary storage area and is temporarily stored therein after it is conveyed out from the warehouse. When a supplying requirement is requested by the upper conveying line body, the electricity meter to be verified in the temporary storage area is conveyed onto the upper conveying line by a roller line, and is conveyed to the verification units through the upper conveying line. After the verification is completed, the electricity meter that has been verified and boxed is conveyed onto the lower conveying line by the verification units, and is conveyed back to the warehouse through the lower conveying line.

Figure 14:
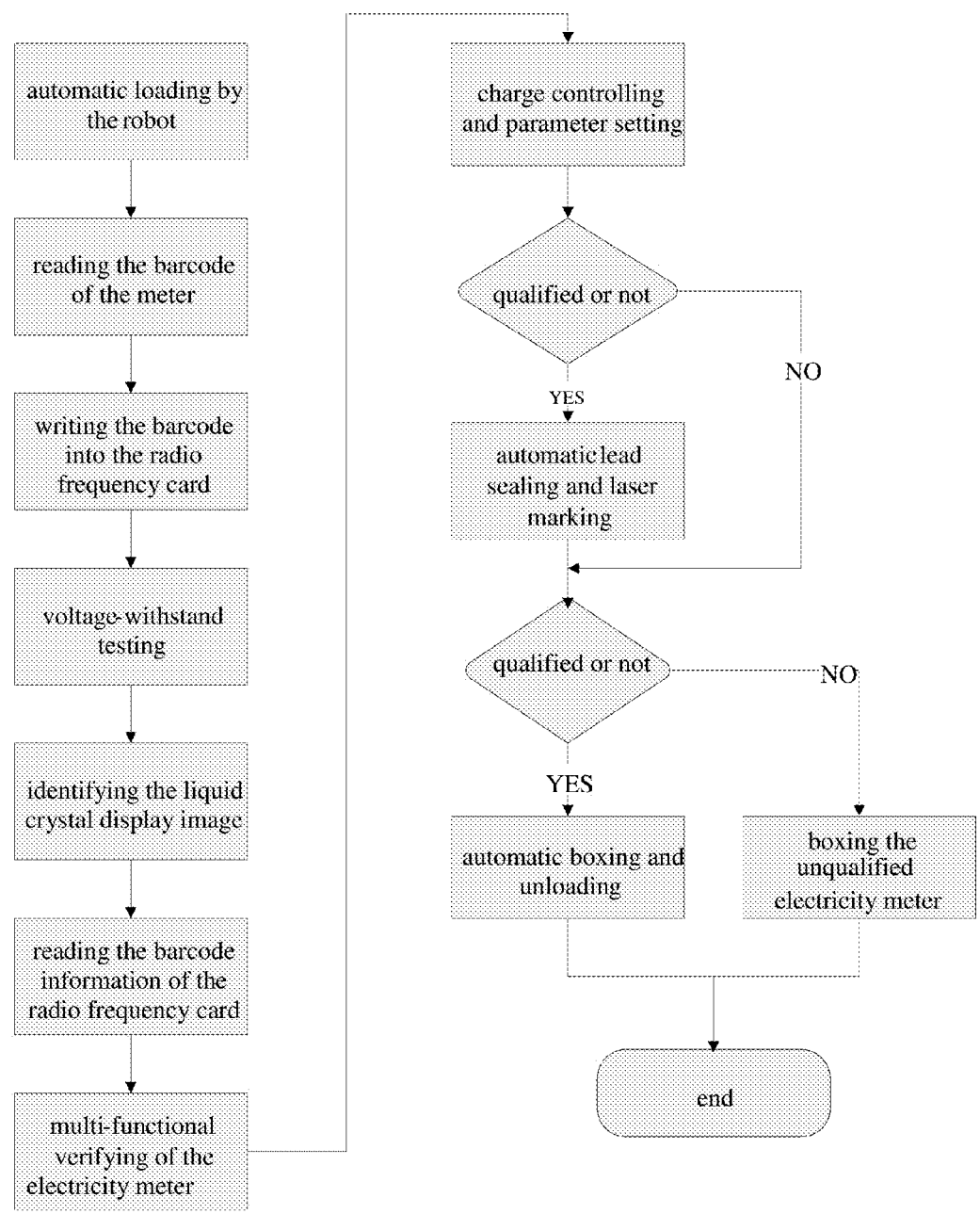
FIG. 14 is an operation flow chart of a verification unit for a single-phase electricity meter according to an embodiment of the present application.
Figure 15:
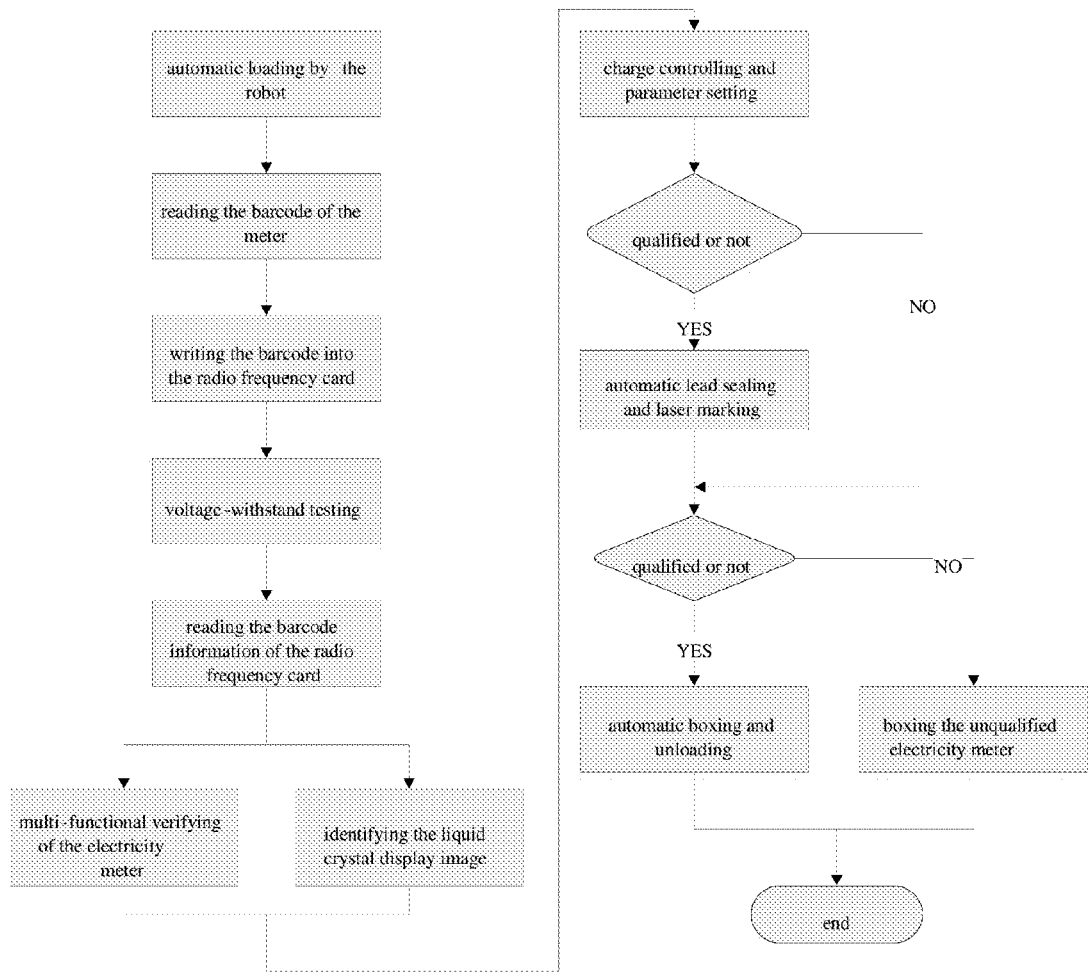
FIG. 15 is an operation flow chart of a verification unit for a three-phase electricity meter according to an embodiment of the present application.

Referring to FIGS. 14 and 15, the process of the smart electricity meter fully-automatic verification will be described in detail, which includes the following steps:

1) a supplying step, the electricity meter to be verified is conveyed from the outlet of the warehouse system, through the logistics conveying line 3-1, to the loading station;

2) a loading step, the electricity meter on the logistics conveying line 3-1 is grabbed by the loading robot onto the pallet located on the verification conveying line 3-5, the information of the pallet and the electricity meter are bound, and the information of the electricity meter is recorded;

3) a voltage-withstand testing step, the electricity meter is conveyed through the verification conveying line 3-5 into the voltage-withstand testing station. The longitudinal crimp drive mechanism is controlled to move forward longitudinally, such that the probes in the connecting terminal are inserted in the electricity meter. Then a high voltage is guided, via the probes, to the electricity meter for the voltage-withstand testing of the electricity meter. After the voltage-withstand testing is completed and the qualified and unqualified electricity meter are recorded by the test module, the longitudinal crimp drive mechanism is controlled by the drive control module back to its initial position, such that the probes are removed from the electricity meter. Thereby the voltage-withstand testing is completed, and it is waiting for the next set of electricity meters to reach;

4) an appearance inspecting step, the pallet is conveyed through the verification conveying line 3-5 to the appearance inspecting station. A picture of the electricity meter is taken by the camera, and the picture taken by the camera is compared with the corresponding stored picture by the appearance inspecting device, to analyze whether the display of the display screen of the electricity meter being inspected is complete and correct. In cases that the electricity meter to be verified is a single-phase electricity meter, the appearance inspecting station may be located in the voltage-withstand testing station, and after the appearance inspecting step and the voltage-withstand testing step are finished, the electrified full screen detection of the electricity meter is performed on the same station. In cases that the electricity meter to be verified is a three-phase electricity meter, the appearance inspecting station is located in the verification station, and the appearance inspecting step and the verification step are performed simultaneously;

5) a programmable switch triggering step, the pallet is conveyed to the programmable switch trigger station through the verification conveying line 3-5. The electricity meter on the pallet is energized by the power supply. Then the cover on the programmable switch is opened by the cover-opening mechanism, and then the programmable switch is triggered by the programmable switch-pressing mechanism, thereby achieving the triggering of the programmable switch;

6) a verifying step, the electricity meter to be verified is conveyed into the loading temporary storage area 3-6 with the verification conveying line 3-5, and the pallet carrying the electricity meter is conveyed to the verification branch. The longitudinal crimp drive mechanism is controlled by the verification device 3-7 on the verification branch to move forward longitudinally, such that the probes in the connecting terminal are inserted into the electricity meter and the electricity meter is energized. The test data is transmitted to the test module through the probes to determine whether the electricity meter is qualified, and the qualified and unqualified electricity meters are recorded by the test module. Then the longitudinal crimp drive mechanism is controlled by the drive control module back to its initial position such that the probes are removed from the electricity meter. Thereby the verification is completed, and it is waiting for the next set of electricity meters to reach;

7) a charge controlling and parameter setting step, the electricity meter having been verified is conveyed to the unloading temporary storage area 3-8 with the verification conveying line 3-5 to evacuate the electricity meter on the verification branch in time. The electricity meter in the unloading temporary storage area 3-8 are conveyed to the charge controlling and parameter setting station with the verification conveying line 3-5, and the electricity meter is energized. The analog card is moved downward and is inserted into the card slot of the electricity meter by the analog card drive mechanism. After the SCM receives the command that the function card should be switched on, the SCM turns on the switching unit of corresponding function card, and turns off the switching unit of other function cards. At this time, said function card is connected to the analog card, the analog card imitates the function of the function card, and thus the information of the electricity meter being tested is read by the card reading module. After all the reading/writing operation of the electricity meter have been completed, all the switching units being turned on are turned off, then the analog card is driven, by the analog card drive mechanism, out of the slot of the electricity meter. Thus, the charge controlling and parameter setting of the electricity meter are completed;

8) a lead sealing and laser marking step, electricity meters the charge controlling and parameter setting of which are completed are conveyed to the lead sealing and laser marking station with the verification conveying line 3-5, such that the qualified electricity meters are sealed with lead and etched with unique codes thereon by the lead sealing and laser marking machine, for identifying the information of the qualified verification, the verification date, the verification personnel and so on. Electric energy meters which are verified to be unqualified will not be sealed or marked, and will be automatically conveyed to the unloading station, waiting for the exception processing;

9) an unloading step, the qualified electricity meter on the pallet on the verification conveying line 3-5 is grabbed and placed into the box located on the logistics conveying line 3-1 by the unloading robot. After the electricity meter is boxed, it is conveyed to the warehouse system with the logistics conveying line 3-1.

The above embodiments are only preferable embodiments of the present application, and the protection scope of the present application is not limited to the embodiments. Those skilled in the art can easily make variations or alternatives without departing from the technical scope of the present application, and all these variations or alternatives should fall within the protection scope of the present application. Therefore, the protection scope of the present application is defined by the claims.

What is claimed is:

1. A fully-automatic verification system for a smart electricity meter comprising a plurality of verification units for the automatic verification of the electricity meter, a main conveying line for connecting the verification units, and a verification management system for coordinating operations of the verification units, wherein the main conveying line comprises an upper conveying line for conveying a meter box, which has an electricity meter to be verified, to the verification unit and a lower conveying line for conveying the meter box, the electricity meter in which has been verified, back to a warehouse;

wherein the verification unit for the electricity meter comprises a logistics conveying line connected to the main conveying line for conveying a turnover box; a loading device located beside a loading station of the logistics conveying line, for moving an electricity meter located on the loading station of the logistics conveying line to a verification conveying line; the verification conveying line for moving the electricity meter to stations corresponded to various devices; a voltage-withstand testing device for a high-voltage detection of the electricity meter; a programmable switch trigger device for turning a cover of the electricity meter and pressing a programmable switch; a verification device for verifying items of the electricity meter to be verified one by one; a lead sealing and laser marking apparatus for the lead sealing and identification information recording of a qualified electricity meter; an unloading device located beside an unloading station of the logistics conveying line, for transferring the electricity meter having been verified from the verification conveying line to the logistics conveying line; and a verification unit-management module for coordinating operations among various devices, the logistics conveying line and the verification conveying line, and an accurate sorting of the electricity meter based on information from the voltage-withstand testing device and the verification device.

2. The fully-automatic verification system for the smart electricity meter according to claim 1, wherein an entrance of the main conveying line is provided with a supplying meter box temporary storage area for temporarily storing the meter box and a meter box barcode reading apparatus; and the meter box barcode reading apparatus is located in front of the meter box temporary storage area.

3. The fully-automatic verification system for the smart electricity meter according to claim 2, wherein an entrance of the verification unit is provided with: a shunting apparatus connected to the upper conveying line of the main conveying line, for shunting the meter box located on the upper conveying line and having an electricity meter to be verified to corresponding verification unit; and a supplying meter box temporary storage area for temporarily storing the meter box; and an exit of the verification unit is provided with a merging apparatus connected to the lower conveying line of the main conveying line, for merging the meter box, the electricity meter in which have been verified, into the lower conveying line.

4. The fully-automatic verification system for the smart electricity meter according to claim 3, wherein the shunting apparatus is provided with a shunting barcode reading apparatus for reading barcodes of smart electricity meters to determine types of the smart electricity meters, to adjust the operating modes of the verification units.

5. The fully-automatic verification system for the smart electricity meter according to claim 4, wherein the verification management system comprises a supplying-discharging control module for controlling the coordinated conveying between a warehouse and the main conveying line, a distributing module for controlling the shunting and the merging of a single verification unit, and a master control module for job scheduling and information monitoring.

6. The fully-automatic verification system for the smart electricity meter according to claim 1, wherein the loading device, the voltage-withstand testing device, the programmable switch trigger device, the verification device, the lead sealing and laser marking device, and the unloading device are arranged sequentially along the advancing convey direction of the verification conveying line.

7. The fully-automatic verification system for the smart electricity meter according to claim 6, wherein the programmable switch trigger device comprises a frame, a base plate fixed to the frame, a cover-turning cylinder assembly for turning the cover of the electricity meter, a motor drive assembly for increasing an angle that the cover of the electricity meter is turned, and a button-pressing cylinder assembly for pressing the programmable switch of the electricity meter, and the cover-turning cylinder assembly, the motor drive assembly and the button-pressing cylinder assembly are provided on the base plate;

the cover-turning cylinder assembly comprises a cover-turning cylinder a cylinder body of which is fixed to the base plate and a piston rod of the same is passed through the base plate downwardly; a cylinder seat connected to an end portion of the piston rod of the cover-turning cylinder; two clamping jaws pivotally connected to the cylinder seat, each clamping jaw is provided with a hook portion which has an inclined surface for insertion, and hook portions of the two clamping jaws are provided opposite to each other; and the cover-turning cylinder assembly further comprises: a guide post parallel to the piston rod of the cover-turning cylinder, and the guide post is fixedly connected to the cylinder seat after passed through a guide hole on the base plate; an elastic pulling member is provided between the two clamping jaws, such that the two clamping jaws are pulled inwardly to hook the cover.

8. The fully-automatic verification system for the smart electricity meter according to claim 7, wherein the motor drive assembly comprises a motor, a belt driven by the motor and movable forward and backward, a roller for contacting with an inner side of the cover so as to change the angle that the cover is turned, and a driving frame connecting the belt with the roller; and the motor drive assembly further comprises a driving wheel connected to the motor, and a driven wheel pivotally connected to the base plate, and the driving wheel and the driven wheel are arranged from front to rear; and the motor is vertically fixed on the base plate, a shaft of the motor is passed through the base plate and is connected to the driving wheel, and the belt is sleeved on peripheries of the driving wheel and the driven wheel.

9. The fully-automatic verification system for the smart electricity meters according to claim 8, wherein the driving wheel and the driven wheel are toothed wheels, and the belt is a synchronous toothed belt cooperated with the toothed wheels; upper and lower end portions of each of the driving wheel and the driven wheel are provided with outwardly protruded disc-shaped limiting members; the driving frame comprises a clamping portion cooperated with the belt, a moving frame which is fixedly connected to the clamping portion and has a guide hole, and a guide rod cooperated with the guide hole of the moving frame and fixed to the base plate in the front and rear direction; and the roller comprises a rigid shaft body at a middle portion and a flexible protective sleeve sleeved on the shaft body, and the shaft body of the roller is vertically and pivotally connected to the moving frame.

10. The fully-automatic verification system for the smart electricity meter according to claim 9, wherein the button-pressing cylinder assembly comprises a button-pressing cylinder a cylinder body of which is fixed to the base plate and a piston rod of the same is passed through the base plate downwardly; and a pressing head provided at a lower end portion of the piston rod of the button-pressing cylinder; and the pressing head is an elastic pressing head which comprises a pressing portion and a mounting portion having a diameter larger than that of the pressing portion, the mounting portion is provided with an insertion hole cooperated with the piston rod of the button-pressing cylinder, and the diameter of the insertion hole is less than that of the piston rod of the button-pressing cylinder, and a limiting member, upper and lower fixed positions of which is adjustable, is provided on the piston rod of the button-pressing cylinder.

11. The fully-automatic verification system for the smart electricity meter according to claim 1, wherein the verification unit further comprises a charge controlling and parameter setting device, an appearance inspecting device for taking pictures of an appearance and a display screen of the electricity meter and performing corresponding processes, an unloading temporary storage area located between the unloading device and the verification device for temporarily storing the electricity meter having been detected, a loading temporary storage area located between the voltage-withstand testing device and the verification device for temporarily storing the electricity meter to be detected, and a turnover box temporary storage area located between the loading device and the unloading device for conveying an empty turnover box at the loading station to the unloading station and temporarily storing the same;

the turnover box temporary storage area is provided with a turnover box conveying line and a turnover box protecting mechanism;

the charge controlling and parameter setting device comprises a main control module for automatically changing a card, an analog card which can be inserted into a card slot of the electricity meter being detected, an analog card drive mechanism connected with the analog card for driving the analog card to move up and down so as to achieve the insertion and removal of the analog card, a card reading module for reading information of the electricity meter being detected, an analog card contact determining module for determining contact information of the analog card based on the information read from the card, and an automatic card changing control module for controlling an SCM to change the card;

the programmable switch trigger unit comprises a power supply for supplying power to the electricity meter, a cover-opening mechanism for opening the cover of the electricity meter and a programmable switch-pressing mechanism for pressing the programmable switch;

the turnover box temporary storage area is provided with a turnover box conveying line and a turnover box protecting mechanism; and the appearance inspecting device is provided on a station at which the voltage-withstand testing device or the verification device is located.

12. The fully-automatic verification system for the smart electricity meter according to claim 1, wherein the verification conveying line comprises a frame, a driving motor provided on the frame for driving a belt to move forward, a belt conveyor connected with a rotary shaft of the driving motor, a stopping mechanism provided on the frame for accurately stopping a pallet on the belt conveyor, a counter provided on the frame for counting the electricity meter, a barcode scanner provided on the frame for recording information of the electricity meter, and a sorting mechanism for sorting the electricity meter;

each verification unit is provided with a plurality of verification branches arranged in parallel;

each verification branch is provided with one verification device; and the beginning and the end of the verification conveying line are connected with each other, and the verification conveying line is provided with a pallet which is cooperated with the verification conveying line and configured for carrying the electricity meter, such that the electricity meter is sequentially conveyed to stations at which the voltage-withstand testing device, the verification device, and the lead sealing and laser marking device are located; a pallet temporary storage area is provided on the verification conveying line between the unloading device and the loading device for temporarily storing the pallet, and the pallet temporary storage area responds to the loading requirement of the loading device.

13. The fully-automatic verification system for the smart electricity meter according to claim 1, wherein the loading device comprises a loading robot for accurately placing an electricity meter, which is to be verified and located on the logistics conveying line, onto a pallet on the verification conveying line and grabbing a turnover material box onto the unloading conveying line such that it is conveyed to the unloading station;

the loading robot comprises a loading robot arm, a controller for controlling the action of the robot arm, and a loading clamp connectable to the lower end of the robot arm;

the unloading device comprises an unloading robot configured for placing an electricity meter having been detected located on the pallet of the verification conveying line into a turnover material box and grabbing the turnover material box onto the logistics conveying line;

the unloading robot comprises an unloading robot arm, a controller for controlling the robot arm to act, and an unloading clamp connectable to a lower end of the unloading robot arm; and the loading robot is provided with a locating platform for accurately locating the electricity meter, and the loading robot arm grabs the electricity meter on the logistics conveying line and places the same on the locating platform such that it is located, and then grabs the electricity meter again and places the same on the pallet located on the verification conveying line.

14. The fully-automatic verification system for the smart electricity meter according to claim 1, wherein the robot loading-unloading device for the electricity meter comprises a meter box conveying chain, a pallet conveying chain and an empty box temporary storage chain, and a multi-axis linkage robot arm is provided among the three chains; the robot arm is provided with a connection joint; a carton clamp and an electricity meter sucking disc are respectively provided with a connection interface cooperated with the connection joint, and the carton clamp and the electricity meter sucking disc are arranged on a replacement platform; and an electricity meter transfer platform is provided at a side of the robot arm, and the transfer platform is provided with electricity meter locating protrusions.

15. The fully-automatic verification system for the smart electricity meter according to claim 14, wherein the carton clamp comprises a clamp frame, one side of the clamp frame is fitted with a connection interface, and the other side thereof is provided with a plurality of pneumatic clamping jaws; and there are three pneumatic clamping jaws which are arranged on the clamp frame in a triangle shape, and two of the pneumatic clamping jaws have the same clamping direction.

16. The fully-automatic verification system for the smart electricity meter according to claim 1, wherein the voltage-withstand testing device for the electricity meter comprises a voltage-withstand platform, a longitudinal crimp drive mechanism provided on the voltage-withstand platform, a connecting terminal connected to the longitudinal crimp drive mechanism and is movable longitudinally, a drive control module connected to the longitudinal crimp drive mechanism for controlling the longitudinal crimp drive mechanism, and a test module connected to the connecting terminal; and the connecting terminal comprises a terminal block connected to the longitudinal crimp drive mechanism and a plurality of probes passed through the terminal block, the probes comprise voltage/current probes for supplying electric power to the electricity meter and signal probes connected with the test module for transmitting detection information of the electricity meter.

17. The fully-automatic verification system for the smart electricity meter according to claim 16, wherein the longitudinal crimp drive mechanism comprises a cylinder which has a piston rod, a dragging plate connected with the piston rod, and a fixed plate arranged below the dragging plate and fixedly connected to the voltage-withstand platform; the cylinder is arranged longitudinally, and the body of the cylinder is fixedly connected to the fixed plate, and the dragging plate is slidably connected to the fixed plate;

the terminal block is provided with two rows of probe holes through which the probes pass, among which the upper row of holes are signal probe holes, and the lower row of holes are voltage/current probe holes, each of the signal probe hole and the voltage/current probe hole is provided with a buffer spring, with one end of the buffer spring abutting against the probe; and a plurality of separating plates are provided at the end of the terminal block connected to the longitudinal crimp drive mechanism, with adjacent current probe holes being provided with one separating plate.

18. The fully-automatic verification system for the smart electricity meter according to claim 1, wherein the verification device comprise a frame, a longitudinal crimp drive mechanism provided on the frame, a connecting terminal which is connected to the longitudinal crimp drive mechanism and is movable longitudinally, a drive control module connected with the longitudinal crimp drive mechanism for controlling the longitudinal crimp drive mechanism to act, and a test module connected with the connecting terminal;

the connecting terminal comprises a terminal block connected with the longitudinal crimp drive mechanism, and a plurality of probes passed through the terminal block, the probe comprises strong and weak electricity pins for connecting the electricity meter; and the voltage-withstand device is provided with a high voltage program-controlled power source connected with strong and weak electric connecting terminals of the electricity meter for providing a high voltage output, and a voltage-withstand platform fixed to the frame, wherein the longitudinal crimp drive mechanism of the voltage-withstand device is provided on the voltage-withstand platform.

* * * * *